United States Patent
Nam et al.

(10) Patent No.: US 10,510,771 B2
(45) Date of Patent: Dec. 17, 2019

(54) THREE-DIMENSIONAL MEMORY DEVICES HAVING PLURALITY OF VERTICAL CHANNEL STRUCTURES

(71) Applicant: Samsung Electronics Co., Ltd., Suwon-si, Gyeonggi-do (KR)

(72) Inventors: Sang-wan Nam, Hwaseong-si (KR); Won-bo Shim, Seoul (KR); Ji-ho Cho, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/182,047

(22) Filed: Nov. 6, 2018

(65) Prior Publication Data
US 2019/0304994 A1  Oct. 3, 2019

(30) Foreign Application Priority Data
Mar. 27, 2018  (KR) ........................ 10-2018-0035268

(51) Int. Cl.
*G11C 16/08* (2006.01)
*H01L 27/11582* (2017.01)
(Continued)

(52) U.S. Cl.
CPC .... *H01L 27/11582* (2013.01); *G11C 16/0483* (2013.01); *G11C 16/08* (2013.01);
(Continued)

(58) Field of Classification Search
CPC ............. H01L 27/11582; H01L 23/528; H01L 27/1157; G11C 16/0483; G11C 16/08; G11C 16/10; G11C 16/14; G11C 16/26
(Continued)

(56) References Cited

U.S. PATENT DOCUMENTS

| 7,679,133 B2 | 3/2010 | Son et al. |
| 8,274,068 B2 | 9/2012 | Nagashima |

(Continued)

FOREIGN PATENT DOCUMENTS

| WO | WO-2017/034647 A1 | 3/2017 |
| WO | WO-2017/164970 A1 | 9/2017 |

OTHER PUBLICATIONS

Extended European Search Report dated Feb. 20, 2019 for corresponding European Application No. 18211469.4.

*Primary Examiner* — Harry W Byrne
(74) *Attorney, Agent, or Firm* — Harness, Dickey & Pierce, P.L.C.

(57) ABSTRACT

A three-dimensional (3D) memory device having a plurality of vertical channel structures includes a first memory block, a second memory block, and a bit line. The first memory block includes first vertical channel structures extending in a vertical direction with respect to a surface of a substrate. The second memory block includes second vertical channel structures on the first vertical channel structures in the vertical direction and first and second string selection lines extending in a first horizontal direction and offset in the vertical direction. The bit line extends in the first horizontal direction between the first and second memory blocks and is shared by the first and second memory blocks. The second memory block may include first and second string selection transistors which are each connected to the bit line and the first string selection line and have different threshold voltages from each other.

20 Claims, 19 Drawing Sheets

(51) Int. Cl.
*H01L 29/10* (2006.01)
*G11C 16/04* (2006.01)
*H01L 27/1157* (2017.01)
*G11C 16/14* (2006.01)
*G11C 16/10* (2006.01)
*G11C 16/26* (2006.01)
*H01L 23/528* (2006.01)

(52) U.S. Cl.
CPC ............. *G11C 16/10* (2013.01); *G11C 16/14* (2013.01); *G11C 16/26* (2013.01); *H01L 23/528* (2013.01); *H01L 27/1157* (2013.01); *H01L 29/1037* (2013.01)

(58) Field of Classification Search
USPC ......... 365/46, 100, 148, 163, 158, 171, 173, 365/185.13, 185.23, 185.25, 210.13, 365/230.03
See application file for complete search history.

(56) References Cited

U.S. PATENT DOCUMENTS

| | | | |
|---|---|---|---|
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,704,293 | B2 | 4/2014 | Park et al. |
| 8,897,089 | B2 | 11/2014 | Kim et al. |
| 8,908,444 | B2 | 12/2014 | Costa et al. |
| 9,070,872 | B2 | 6/2015 | Huo et al. |
| 9,257,186 | B2* | 2/2016 | D'Abreu ................ G11C 16/10 |
| 9,502,471 | B1 | 11/2016 | Lu et al. |
| 9,691,781 | B1 | 6/2017 | Nishikawa et al. |
| 9,716,129 | B1 | 7/2017 | Sim et al. |
| 9,721,668 | B2 | 8/2017 | Yeh et al. |
| 2010/0117143 | A1 | 5/2010 | Lee et al. |
| 2011/0233648 | A1 | 9/2011 | Seol et al. |
| 2014/0192584 | A1 | 7/2014 | Aritome |
| 2015/0325298 | A1* | 11/2015 | D'Abreu ................ G11C 16/10 365/185.09 |
| 2016/0267981 | A1 | 9/2016 | Hioka |

* cited by examiner

FIG. 7A

| READ BIAS for BLKa | |
|---|---|
| V_GSLa_sel | Vread |
| V_SSLua_sel, V_SSLda_sel | V1 |
| V_SSLua_unsel, V_SSLda_unsel | V2 |
| V_WLa_sel | Vsel |
| V_WLa_unsel | Vread |

FIG. 7B

| READ BIAS for BLKb | |
|---|---|
| V_GSLb_sel | Vread |
| V_SSLb_sel | V1 |
| V_SSLb_unsel | V2 |
| V_WLb_sel | Vsel |
| V_WLb_unsel | Vread |

| ERASE BIAS for BLKa | |
|---|---|
| V_SUB | Vers (20 V) |
| V_WLa | Vwe (0 V) |
| SSLua, SSLda | FLOAT |
| GSLa | FLOAT |
| BL | FLOAT |

| ERASE BIAS for BLKb | |
|---|---|
| V_CSLb | Vgidl → Vers (20 V) |
| V_WLb | Vwe (0 V) |
| SSLb | FLOAT |
| V_GSLb | Vbias |
| BL | FLOAT |

| ERASE BIAS for BLKa | |
|---|---|
| V_BL | Vgidl → Vers (20 V) |
| V_WLa | Vwe (0 V) |
| V_SSLua, V_SSLda | Vbias |
| GSLa | FLOAT |
| CSLa | FLOAT |

| ERASE BIAS for BLKb | |
|---|---|
| V_BL | Vgidl → Vers (20 V) |
| V_WLb | Vwe (0 V) |
| V_SSLb | Vbias |
| GSLb | FLOAT |
| CSLb | FLOAT |

FIG. 14A

| PROGRAM BIAS for BLKa | |
|---|---|
| V_CSLa | Vca (2 V) |
| V_GSLa | Vga (0.3 V) |
| V_SSLua_sel, V_SSLda_sel | V1 |
| V_SSLua_unsel, V_SSLda_unsel | V2 |
| V_BL | 0 V |
| V_WLa_sel | Vpgm |
| V_WLa_unsel | Vpass |

FIG. 14B

| PROGRAM BIAS for BLKb | |
|---|---|
| V_CSLb | Vcb (0 V) |
| V_GSLb | Vgb (0 V) |
| V_SSLb_sel | V1 |
| V_SSLb_unsel | V2 |
| V_BL | 0 V |
| V_WLb_sel | Vpgm |
| V_WLb_unsel | Vpass |

FIG. 17

|  | READ BIAS for BLKb1 | READ BIAS for BLKb1' |
|---|---|---|
| V_SSLb_sel | V1 ||
| V_SSLb_unsel | V2 ||
| V_GSSL1 | Von | Voff |
| V_GSSL2 | Voff | Von |
| V_WLb_sel | Vsel ||
| V_WLb_unsel | Vread ||

THREE-DIMENSIONAL MEMORY DEVICES HAVING PLURALITY OF VERTICAL CHANNEL STRUCTURES

CROSS-REFERENCE TO RELATED APPLICATION

This application claims the benefit, under 35 U.S.C. § 119, of Korean Patent Application No. 10-2018-0035268, filed on Mar. 27, 2018, in the Korean Intellectual Property Office, the disclosure of which is incorporated herein in its entirety by reference.

BACKGROUND

The inventive concepts relate to memory devices, and more particularly, to three-dimensional (3D) memory devices, each having a plurality of vertical channel structures.

Memory devices are used to store data and may be classified into volatile memory devices and nonvolatile memory devices. Flash memory devices, as an example of nonvolatile memory devices, may be used ("included") in mobile phones, digital cameras, portable digital assistants (PDAs), portable computer devices, stationary computer devices, some combination thereof, or the like. With the recent multifunctionalization of information and communication devices, memory devices may have a high capacity and a high integration density.

SUMMARY

According to some example embodiments of the inventive concepts, a three-dimensional (3D) memory device may include a first memory block including a plurality of first vertical channel structures, each first vertical channel structure of the plurality of first vertical channel structures extending in a vertical direction that is substantially perpendicular with respect to a surface of a substrate. The 3D memory device may include a second memory block including a plurality of second vertical channel structures, a first string selection line, and a second string selection line, each second vertical channel structure of the plurality of second vertical channel structures offset above the plurality of first vertical channel structures in the vertical direction, the first string selection line and the second string selection line extending in a first horizontal direction and being offset from each other in the vertical direction, the first horizontal direction being substantially parallel with respect to the surface of the substrate. The 3D memory device may include a bit line extending in the first horizontal direction between the first memory block and the second memory block and configured to be shared by the first and second memory blocks. The second memory block may further include a first string selection transistor and a second string selection transistor, the first string selection transistor and the second string selection transistor each connected to the bit line and the first string selection line, the first string selection transistor and the second string selection transistor having different threshold voltages from each other.

According to some example embodiments of the inventive concepts, a three-dimensional (3D) memory device may include a first memory block including a plurality of first vertical channel structures offset in a vertical direction that is substantially perpendicular with respect to a surface of a substrate, a second memory block including a plurality of second vertical channel structures on the first vertical channel structures in the vertical direction, and a bit line extending in a first horizontal direction between the first memory block and the second memory block, the bit line configured to be shared by the first memory block and the second memory block, the first horizontal direction being substantially parallel with respect to the surface of the substrate. The first memory block may further include a first upper string selection line extending in a second horizontal direction on the bit line, the second horizontal direction being substantially parallel with respect to the surface of the substrate and substantially perpendicular with respect to the first horizontal direction, a first lower string selection line extending in the second horizontal direction on the first upper string selection line, a first upper string selection transistor connected to the first upper string selection line and having a first threshold voltage, and a first lower string selection transistor connected to the first lower string selection line and having a second threshold voltage, the second threshold voltage less than the first threshold voltage.

According to some example embodiments of the inventive concepts, a three-dimensional (3D) memory device may include a first memory block including a plurality of first vertical channel structures, each first vertical channel structure of the plurality of first vertical channel structures extending in a vertical direction that is substantially perpendicular with respect to a surface of a substrate. The 3D memory device may include a first bit line on the first memory block in the vertical direction and extending in a first horizontal direction, the first horizontal direction being substantially parallel with respect to the surface of the substrate. The 3D memory device may include a second memory block on the first bit line in the vertical direction, the second memory block including a plurality of second vertical channel structures. The 3D memory device may include a first common source line located on the second memory block in the vertical direction and extending in the first horizontal direction. The 3D memory device may include a third memory block including a plurality of third vertical channel structures, a plurality of ground selection lines, and a plurality of ground selection transistors, the plurality of third vertical channel structures on the first common source line in the vertical direction, the plurality of ground selection lines extending in the first horizontal direction and offset in the vertical direction, and the plurality of ground selection transistors being connected to the first common source line and one of the plurality of ground selection lines and having different threshold voltages from each other. The first memory block and the second memory block may share the first bit line, and the second memory block and the third memory block may share the first common source line.

BRIEF DESCRIPTION OF THE DRAWINGS

Example embodiments of the inventive concepts will be more clearly understood from the following detailed description taken in conjunction with the accompanying drawings in which:

FIGS. 7A and 7B show examples of read bias conditions for first and second memory blocks of FIG. 5, according to some example embodiments of the inventive concepts;

FIGS. 14A and 14B show examples of program bias conditions for the first and second memory blocks of FIG. 5, according to some example embodiments of the inventive concepts;

FIG. 17 shows an example of read bias conditions for the 3D memory device of FIG. 16;

DETAILED DESCRIPTION OF THE EMBODIMENTS

Figure 1:
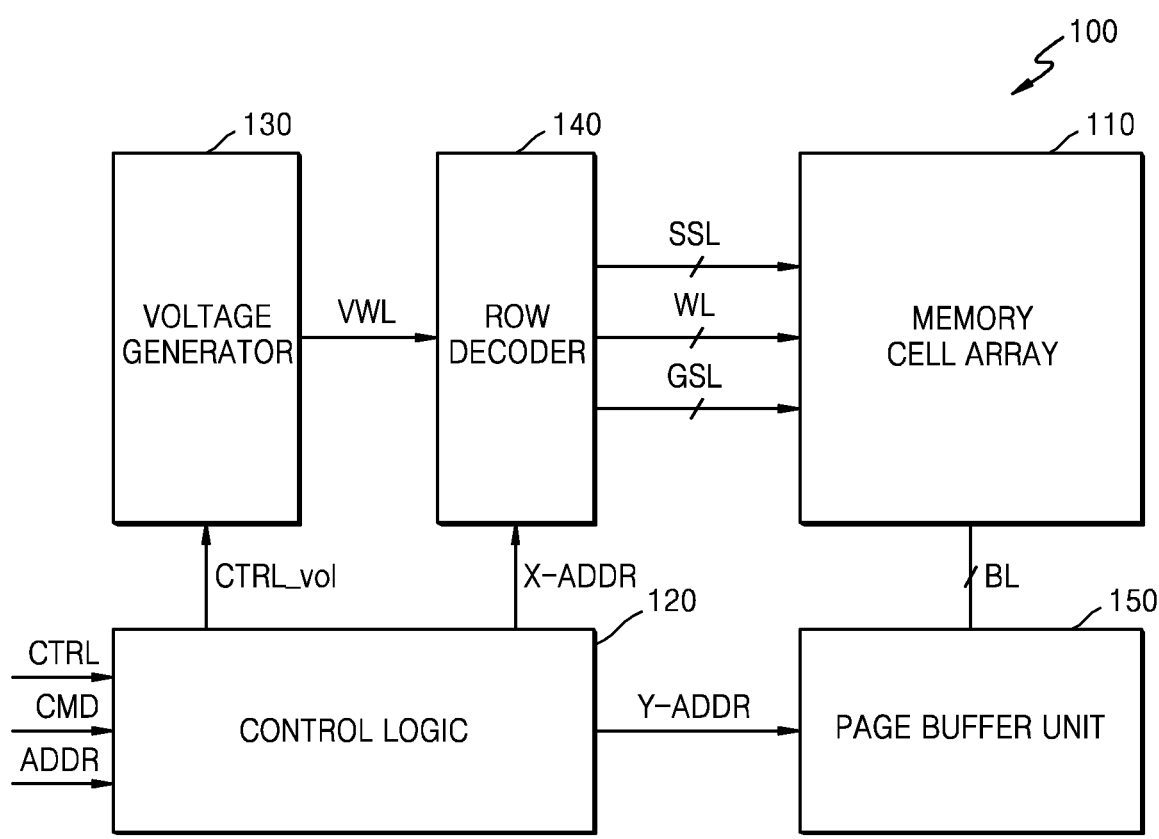
FIG. 1 is a block diagram of a memory device according to some example embodiments of the inventive concepts.

FIG. 1 is a block diagram of a memory device 100 according to some example embodiments of the inventive concepts.

Referring to FIG. 1, the memory device 100 may include a memory cell array 110, a control logic 120, a voltage generator 130, a row decoder 140, and a page buffer unit 150. Although not shown in FIG. 1, the memory device 100 may further include a data input/output circuit or an input/output interface.

The memory cell array 110 may be connected to the page buffer unit 150 through bit lines BL and to the row decoder 140 through word lines WL, string selection lines SSL, and ground selection lines GSL. The memory cell array 110 may include a plurality of memory cells, e.g., flash memory cells. Hereinafter, it is assumed that the memory cells are NAND flash memory cells in the descriptions of embodiments of the inventive concepts. However, the inventive concepts are not limited thereto. In some example embodiments, the memory cells may be resistive memory cells such as resistive random access memory (ReRAM) cells, phase-change RAM (PRAM) cells, or magnetic RAM (MRAM) cells.

Figure 2:
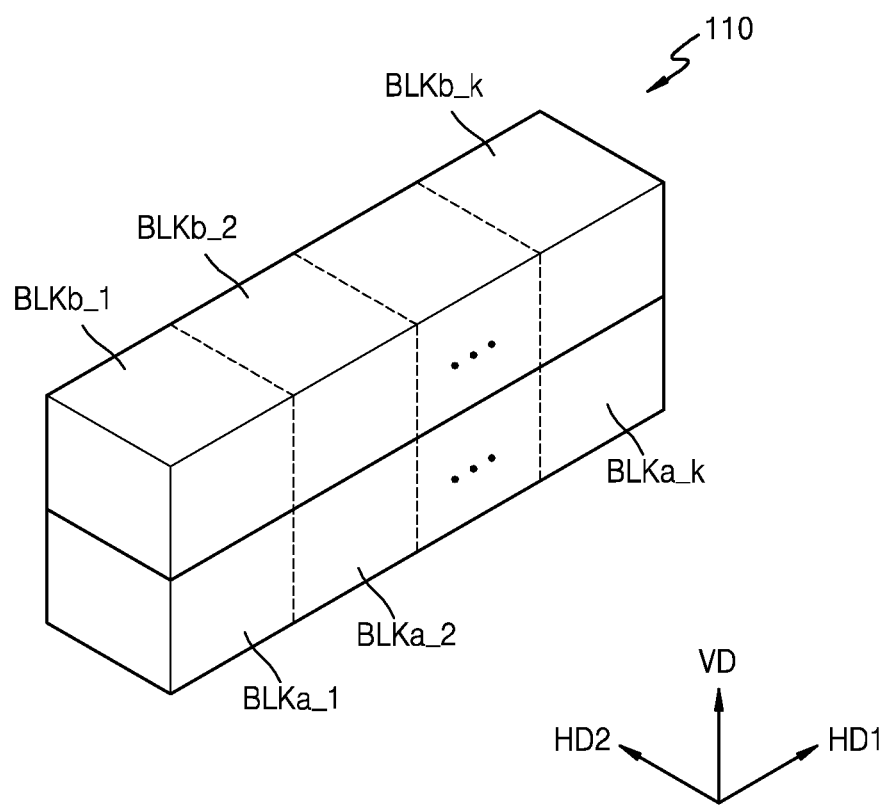
FIG. 2 is a diagram of a memory cell array of FIG. 1, according to some example embodiments of the inventive concepts.

FIG. 2 is a diagram of the memory cell array 110 of FIG. 1, according to some example embodiments of the inventive concepts.

Referring to FIG. 2, the memory cell array 110 may include lower memory blocks BLKa_1 through BLKa_k and upper memory blocks BLKb_1 through BLKb_k. Here, "k" may be a natural number and may vary with embodiments. The upper memory blocks BLKb_1 through BLKb_k may be respectively located above the lower memory blocks BLKa_1 through BLKa_k in a vertical direction VD. Each of the lower and upper memory blocks BLKa_1 through BLKa_k and BLKb_1 through BLKb_k may have a three-dimensional (3D) structure, and therefore, the memory cell array 110 may be referred to as a "3D memory cell array" and the memory device 100 may be referred to as a "3D memory device".

Each of the lower and upper memory blocks BLKa_1 through BLKa_k and BLKb_1 through BLKb_k may include a plurality of vertical channel structures. The plurality of vertical channel structures may correspond to a plurality of NAND strings. Each of the NAND strings may include memory cells respectively connected to word lines vertically stacked on a substrate. Each of the memory cells may include a charge trap layer. The disclosures of U.S. Pat. Nos. 7,679,133, 8,553,466, 8,654,587, 8,559,235, and U.S. Patent Application Publication No. 2011/0233648 are incorporated herein in its entirety by reference.

Referring back to FIG. 1, the control logic 120 may output various control signals, e.g., a voltage control signal CTRL_vol, a row address X-ADDR, and a column address Y-ADDR, for programming data to the memory cell array 110, reading data from the memory cell array 110, or erasing data from the memory cell array 110 based on a command CMD, an address ADDR, and a control signal CTRL. Accordingly, the control logic 120 may generally control various operations of the memory device 100.

The voltage generator 130 may generate various voltages for performing program, read, and erase operations on the memory cell array 110 based on the voltage control signal CTRL_vol. In detail, the voltage generator 130 may generate a word line voltage VWL, e.g., a program voltage, a read voltage, a pass voltage, an erase verify voltage, or a program verify voltage. The voltage generator 130 may also generate a string selection line voltage and a ground selection line voltage based on the voltage control signal CTRL_vol.

The row decoder 140 may select one of the lower and upper memory blocks BLKa_1 through BLKa_k and BLKb_1 through BLKb_k, select one of word lines WL of the selected memory block, and select one of the string selection lines SSL, in response to the row address X-ADDR. The page buffer unit 150 may select some of the bit lines BL in response to the column address Y-ADDR. In detail, the page buffer unit 150 operates as a write driver or a sense amplifier according to an operating mode.

Figure 3:
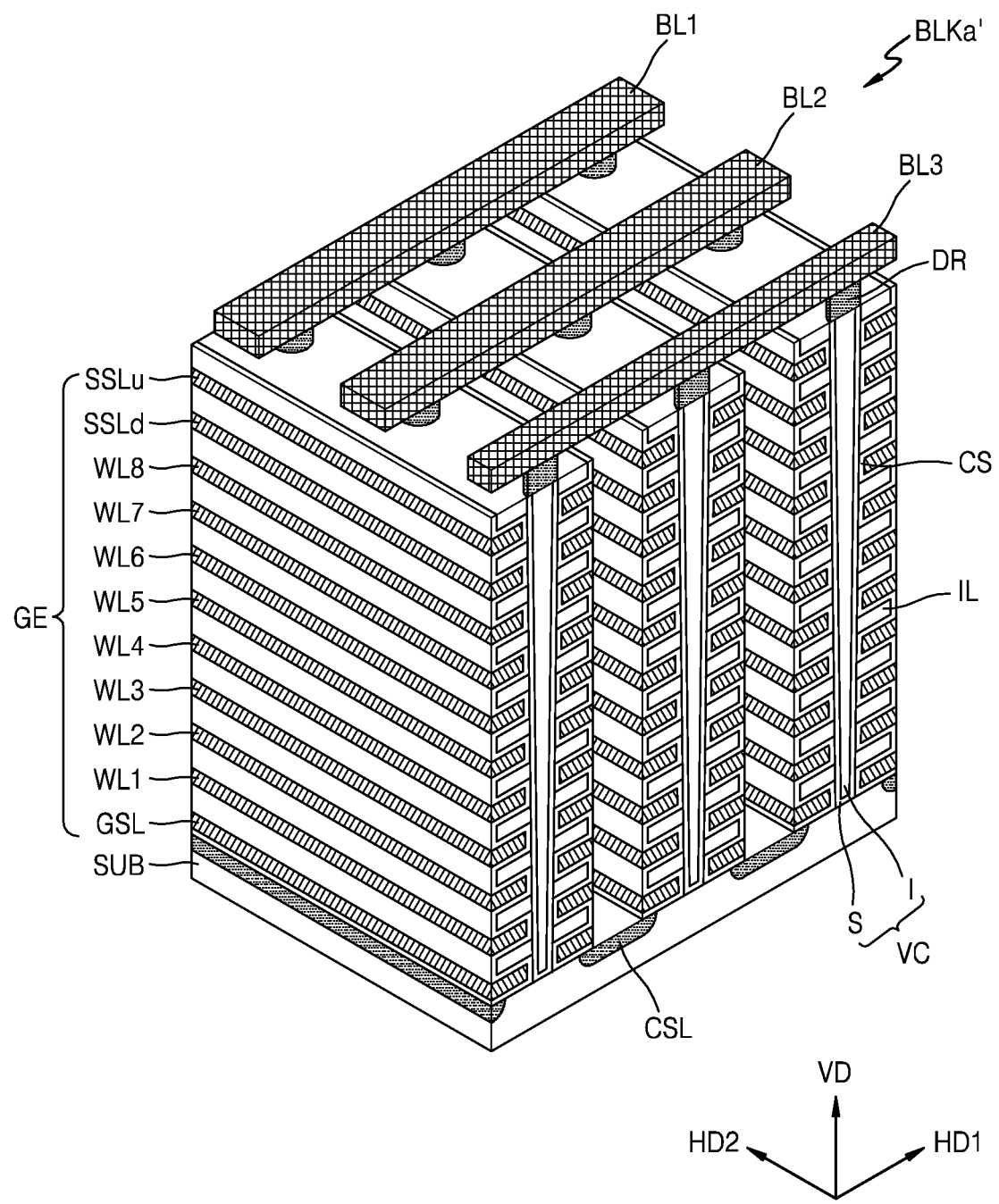
FIG. 3 is a perspective view of an example of a lower memory block, according to some example embodiments of the inventive concepts.

FIG. 3 is a perspective view of an example BLKa' of a lower memory block, according to some example embodiments of the inventive concepts. The lower memory block BLKa' may be one of the lower memory blocks BLKa_1 through BLKa_k.

Referring to FIG. 3, the lower memory block BLKa' is formed on a substrate SUB in the vertical direction VD. The substrate SUB has a first conductivity type (e.g., a p-type). A common source line CSL doped with second conductivity type (e.g., n-type) impurities is provided in the substrate SUB to extend in a second horizontal direction HD2. Insulating layers IL are provided on the substrate SUB between two adjacent common source lines CSL. The insulating layers IL are spaced a predetermined distance apart in a first horizontal direction HD1. The insulating layers IL may include an insulating material such as silicon oxide.

Pillars or vertical channel structures VC penetrating through the insulating layers IL in the vertical direction VD are sequentially placed in the first horizontal direction HD1 on the substrate SUB between the two adjacent common source lines CSL. For example, a surface layer S of each vertical channel structure VC may include a silicon material having the first conductivity type and may function as a channel region. An inner layer I of each vertical channel structure VC may include an insulating material such as silicon oxide or an air gap. In the vertical channel structures VC, the size of a channel hole may decrease toward the substrate SUB.

A charge storage layer CS is provided along exposed surfaces of the insulating layers IL, the vertical channel structures VC, and the substrate SUB in a region between the two adjacent common source lines CSL. The charge storage layer CS may include a tunneling insulating layer, a charge trap layer, and a blocking insulating layer. The charge storage layer CS may have an oxide-nitride-oxide (ONO) structure. Gate electrodes GE, such as a ground selection line GSL, a lower string selection line SSLd, an upper string selection line SSLu, and word lines WL1 through WL8, are provided on an exposed surface of the charge storage layer CS in the region between the two adjacent common source lines CSL. Drain contacts DR are provided on each of the vertical channel structures VC. Bit lines BL1 through BL3 are provided on the drain contacts DR. The bit lines BL1 through BL3 extend in the first horizontal direction HD1 and are spaced a predetermined distance apart in the second horizontal direction HD2.

As the length of the vertical channel structures VC is increased, the number of word lines stacked in the vertical direction VD may be increased, and thus, the number of memory cells in the vertical direction VD may also be increased. As a result, the storage capacity and integration density of the memory device 100 may be increased. However, when the length of the vertical channel structures VC is increased, channel resistance may also be increased, and therefore, current flowing in each memory cell may be decreased. When the current flowing in the memory cell is approximately a minimum current for sensing, the sensing may no longer be performed.

However, according to embodiments of the inventive concepts, the vertical channel structures VC may be located in the vertical direction VD by limiting the length of the vertical channel structures VC to a threshold value and repeatedly performing an etching process for forming a vertical channel structure VC. Accordingly, the storage capacity and integration density of the memory device 100 may be increased without increasing the channel resistance. For example, the lower memory block BLKa_1 of FIG. 2 may include first vertical channel structures and the upper memory block BLKb_1 of FIG. 2 may include second vertical channel structures located in the vertical direction VD with respect to the first vertical channel structures. At this time, the lower memory block BLKa_1 and the upper memory block BLKb_1 may share a bit line, and therefore, process cost may be reduced.

Figure 4:
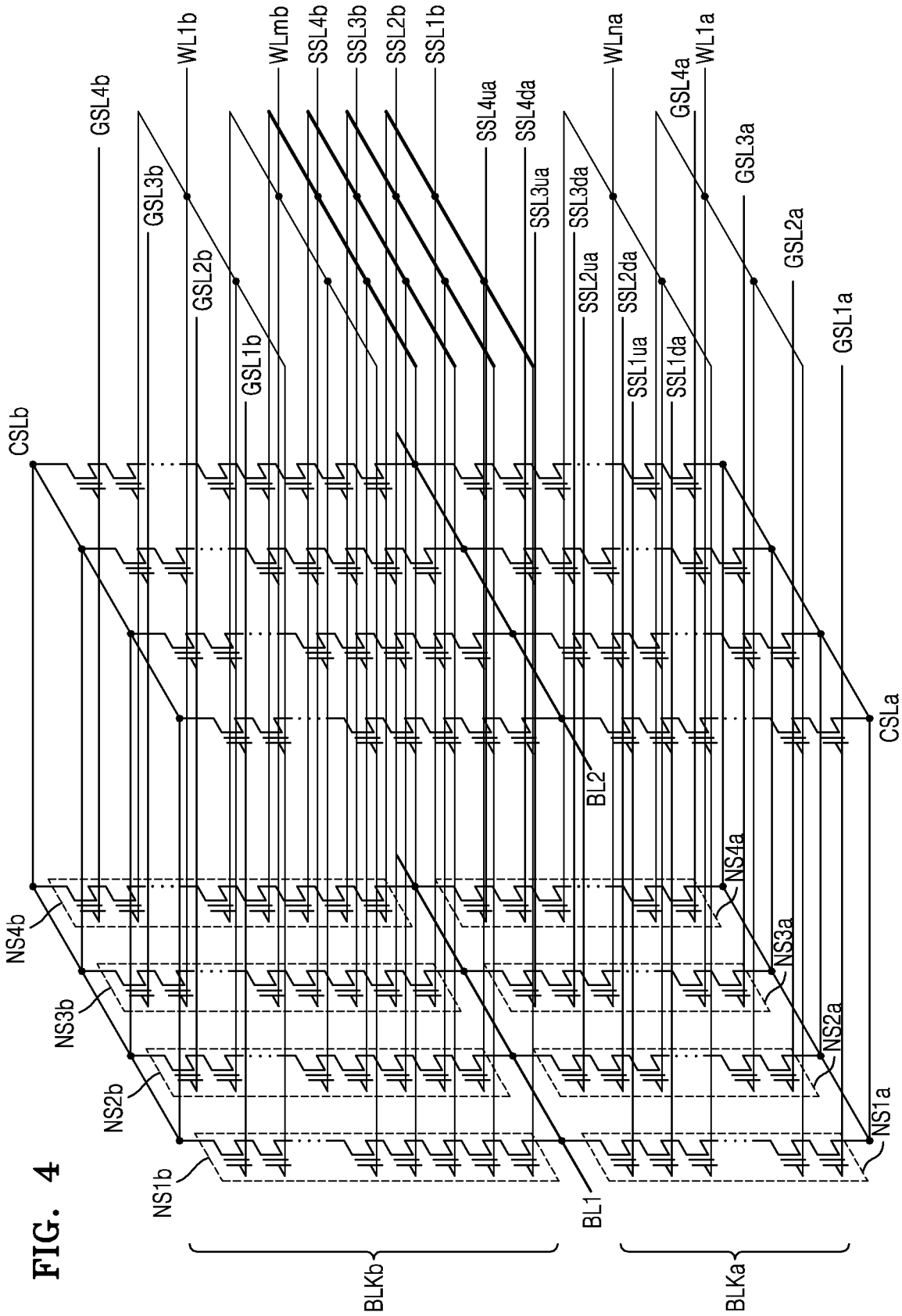
FIG. 4 is an example circuit diagram of first and second memory blocks according to some example embodiments of the inventive concepts.

FIG. 4 is an example circuit diagram of first and second memory blocks BLKa and BLKb according to some example embodiments of the inventive concepts.

Referring to FIG. 4, the first memory block BLKa may be one of the lower memory blocks BLKa_1 through BLKa_k, and the second memory block BLKb may be one of the upper memory blocks BLKb_1 through BLKb_k and may be located above the first memory block BLKa in the vertical direction VD.

Figure 5:
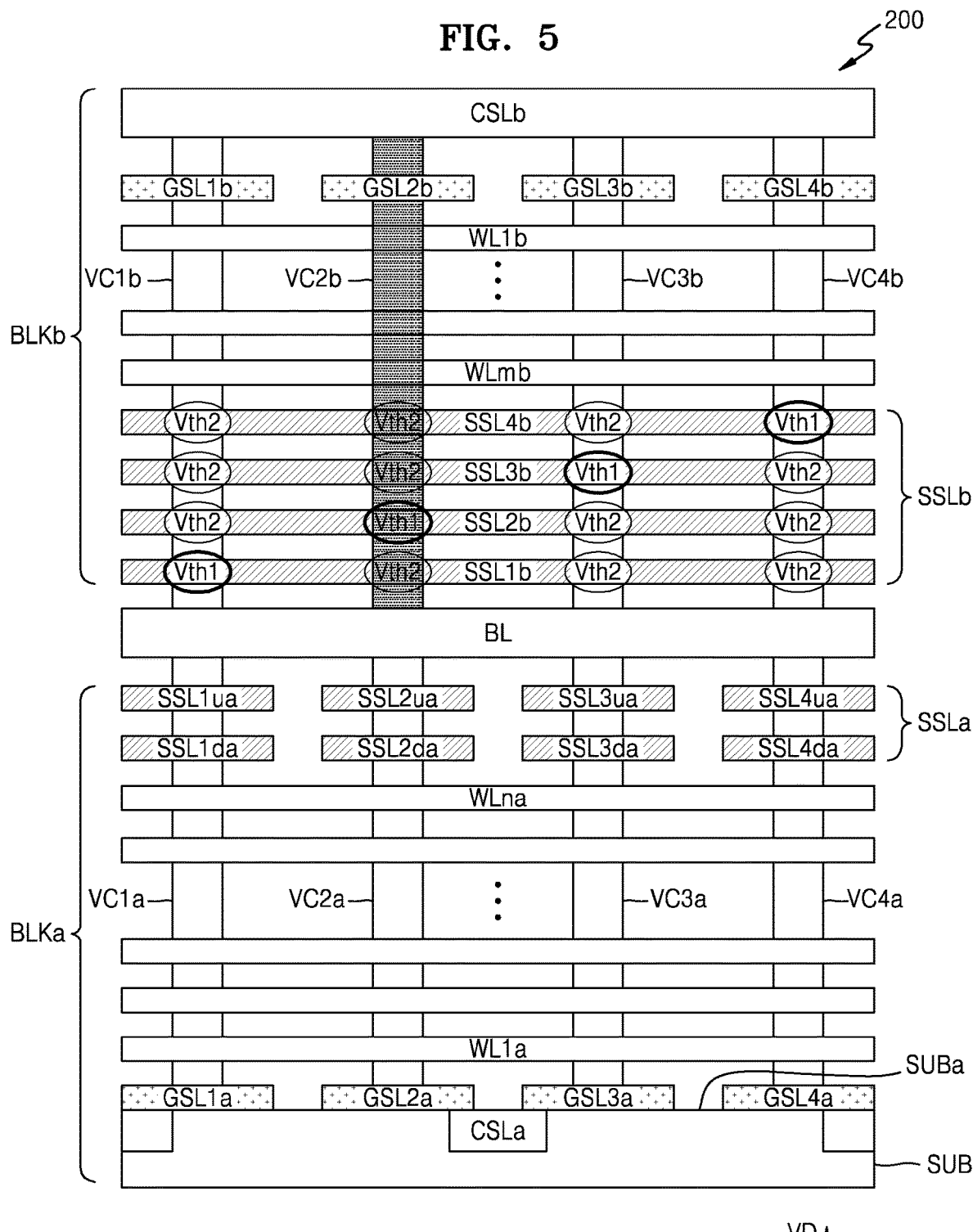
FIG. 5 is a cross-sectional view of a three-dimensional (3D) memory device according to some example embodiments of the inventive concepts.

The first memory block BLKa may include a plurality of lower NAND strings including NAND strings NS1a through NS4a, word lines WL1a through WLna, first through fourth ground selection lines GSL1a through GSL4a, first through fourth lower string selection lines SSL1da through SSL4da, first through fourth upper string selection lines SSL1ua through SSL4ua, and a common source line CSLa. As shown in FIG. 5, common source line CSLa extends in a second horizontal direction HD2 and is on the substrate SUB. Here, "n" may be a natural number and may vary with embodiments. In some example embodiments, the first through fourth ground selection lines GSL1a through GSL4a may have a line shape. In some example embodiments, the first through fourth ground selection lines GSL1a through GSL4a may each have a plate shape.

In some example embodiments, the first through fourth ground selection lines GSL1a through GSL4a located at the same level may be electrically connected to one another in the first memory block BLKa. In some example embodiments, the first memory block BLKa may include one of the first through fourth upper string selection lines SSL1ua through SSL4ua or one of the first through fourth lower string selection lines SSL1da through SSL4da. In some example embodiments, the first memory block BLKa may further include at least one dummy word line below the first through fourth lower string selection lines SSL1da through SSL4da.

The second memory block BLKb may include a plurality of upper NAND strings including NAND strings NS1b through NS4b, word lines WL1b through WLmb, first through fourth ground selection lines GSL1b through GSL4b, first through fourth string selection lines SSL1b through SSL4b, and a common source line CSLb. Here, "m" may be a natural number and may vary with embodiments. In some example embodiments, the first through fourth ground selection lines GSL1b through GSL4b may have a line shape. In some example embodiments, the first through fourth ground selection lines GSL1b through GSL4b may each have a plate shape.

In some example embodiments, "m" may be lower than "n", and therefore, the second memory block BLKb may include fewer word lines than the first memory block BLKa. However, the inventive concepts are not limited thereto. In some example embodiments, "m" may be equal to "n", and therefore, the first memory block BLKa and the second memory block BLKb may include the same number of word lines. In some example embodiments, the first through fourth ground selection lines GSL1b through GSL4b located at the same level may be electrically connected to one another in the second memory block BLKb. In some example embodiments, the second memory block BLKb may further include at least one dummy word line above the first through fourth string selection lines SSL1b through SSL4b.

The lower NAND strings included in the first memory block BLKa may be connected to the first and second bit lines BL1 and BL2, and the upper NAND strings included in the second memory block BLKb may also be connected to the first and second bit lines BL1 and BL2. Accordingly, the first and second memory blocks BLKa and BLKb may share the first and second bit lines BL1 and BL2. In detail, opposite ends of the NAND string NS1a may be respectively connected to the first bit line BL1 and the common source line CSLa, and opposite ends of the NAND string NS1b may be respectively connected to the common source line CSLb and the first bit line BL1.

FIG. 5 is a cross-sectional view of a 3D memory device 200 according to some example embodiments of the inventive concepts.

Referring to FIG. 5, the 3D memory device 200 may include the first and second memory blocks BLKa and BLKb and a bit line BL. The bit line BL may be between the first memory block BLKa and the second memory block BLKb and may extend in the first horizontal direction HD1. The first and second memory blocks BLKa and BLKb may be electrically connected to the bit line BL and thus share the bit line BL. For example, the first and second memory blocks BLKa and BLKb may respectively correspond to the first and second memory blocks BLKa and BLKb of FIG. 4, and the bit line BL may correspond to the first bit line BL1 of FIG. 4.

The first memory block BLKa is on (e.g., may be directly on) the substrate SUB and may include a plurality of first vertical channel structures VC1a through VC4a, where each first vertical channel structure is extending ("extends") above ("on") the substrate SUB in the vertical direction VD. As described herein, and for example as shown in FIG. 5, the vertical direction VD may be a direction that is perpendicular or substantially perpendicular (e.g., perpendicular within manufacturing tolerances and/or material tolerances) with respect to a surface SUBa of substrate SUB, the first horizontal direction HD1 may be parallel or substantially parallel (e.g., parallel within manufacturing tolerances and/ or material tolerances) with respect to the surface SUBa of the substrate SUB, and the second horizontal direction HD2 may be parallel or substantially parallel with respect to the surface SUBa of the substrate SUB and perpendicular or substantially perpendicular with respect to the first horizontal direction HD1. The first memory block BLKa may include the common source line CSLa, the first through fourth ground selection lines GSL1a through GSL4a, the word lines WL1a through WLna, the first through fourth lower string selection lines SSL1da through SSL4da, and the first through fourth upper string selection lines SSL1ua through SSL4ua. As shown in at least FIG. 5, each upper string selection line SSL1ua through SSL4ua may be on (e.g., "above," "below," "beneath," or the like) and adjacent to the bit line BL in the vertical direction VD and may extend in the second horizontal direction HD2, and each lower string selection line SSL1da through SSL4da may be on (e.g., "above," "below," "beneath," or the like) and adjacent to one or more upper string selection lines SSL1ua through SSL4ua in the vertical direction VD and may extend in the second horizontal direction HD2. As further shown, each upper string selection line SSL1ua through SSL4ua is closer to the bit line BL than a corresponding adjacent lower string selection line SSL1da through SSL4da. As further shown, the first through fourth ground selection lines GSL1a through GSL4a may each extend in the second horizontal direction on (e.g., directly on) the substrate SUB. The word lines WL1a through WLna may extend in the first horizontal direction HD1. The first through fourth ground selection lines GSL1a through GSL4a, the first through fourth lower string selection lines SSL1da through SSL4da, and the first through fourth upper string selection lines SSL1ua through SSL4ua may extend in the second horizontal direction HD2 and may be parallel or substantially parallel (e.g., parallel within manufacturing tolerances and/or material tolerances) to each other in the first horizontal direction HD1.

The second memory block BLKb may be located (e.g., "offset") in the vertical direction VD with respect to the first memory block BLKa and may include a plurality of second vertical channel structures VC1b through VC4b where each second vertical channel structure is extending ("extends") above the bit line BL in the vertical direction VD. Thus, the second vertical channel structures VC1b through VC4b will be understood to be on the first vertical channel structures VC1a through VC4a in the vertical direction VD. As shown, the second memory block BLKb may be on (e.g., directly on) the bit line BL The second memory block BLKb may include the common source line CSLb, the first through fourth ground selection lines GSL1b through GSL4b, the word lines WL1b through WLmb, and the first through fourth string selection lines SSL1b through SSL4b. In some example embodiments, the common source line CSLb may be considered to be separate from the second memory block BLKb and on the second memory block BLKb in the vertical direction VD and extending in the first horizontal direction HD1. The common source line CSLb, the word lines WL1b through WLmb, and the first through fourth string selection lines SSL1b through SSL4b may each extend in the first horizontal direction HD1. As shown in at least FIG. 5, the first through fourth string selection lines SSL1b through SSL4b may be offset from each other ("stacked") in the vertical direction VD. As shown, the common source line CSLb may be connected in common to the second vertical channel structures VC1b through VC4b. As further shown, the first through fourth ground selection lines GSL1b through GSL4b may each extend in the second horizontal direction on (e.g., directly on) the common source line CSLb. The first through fourth ground selection lines GSL1b through GSL4b may extend in the second horizontal direction HD2. For example, the NAND string (NS2b of FIG. 6) corresponding to the second vertical channel structure VC2b may be selected, and detailed operations involved in the selection will be described with reference to FIG. 9. In some example embodiments, the common source line CSLb may have a line shape. In some example embodiments, the common source line CSLb may have a plate shape. However, the inventive concepts are not limited thereto, and the structure of the common source line CSLb may be variously changed.

It will be understood herein that an element that is "on" another element may be "above" or "below" (also referred to herein as "beneath") the other element and/or may be "directly on" or "indirectly on" the other element, where an element that is indirectly on the other element will be understood to be isolated from direct contact with the other element by at least one interposing element and/or space.

Figure 6:
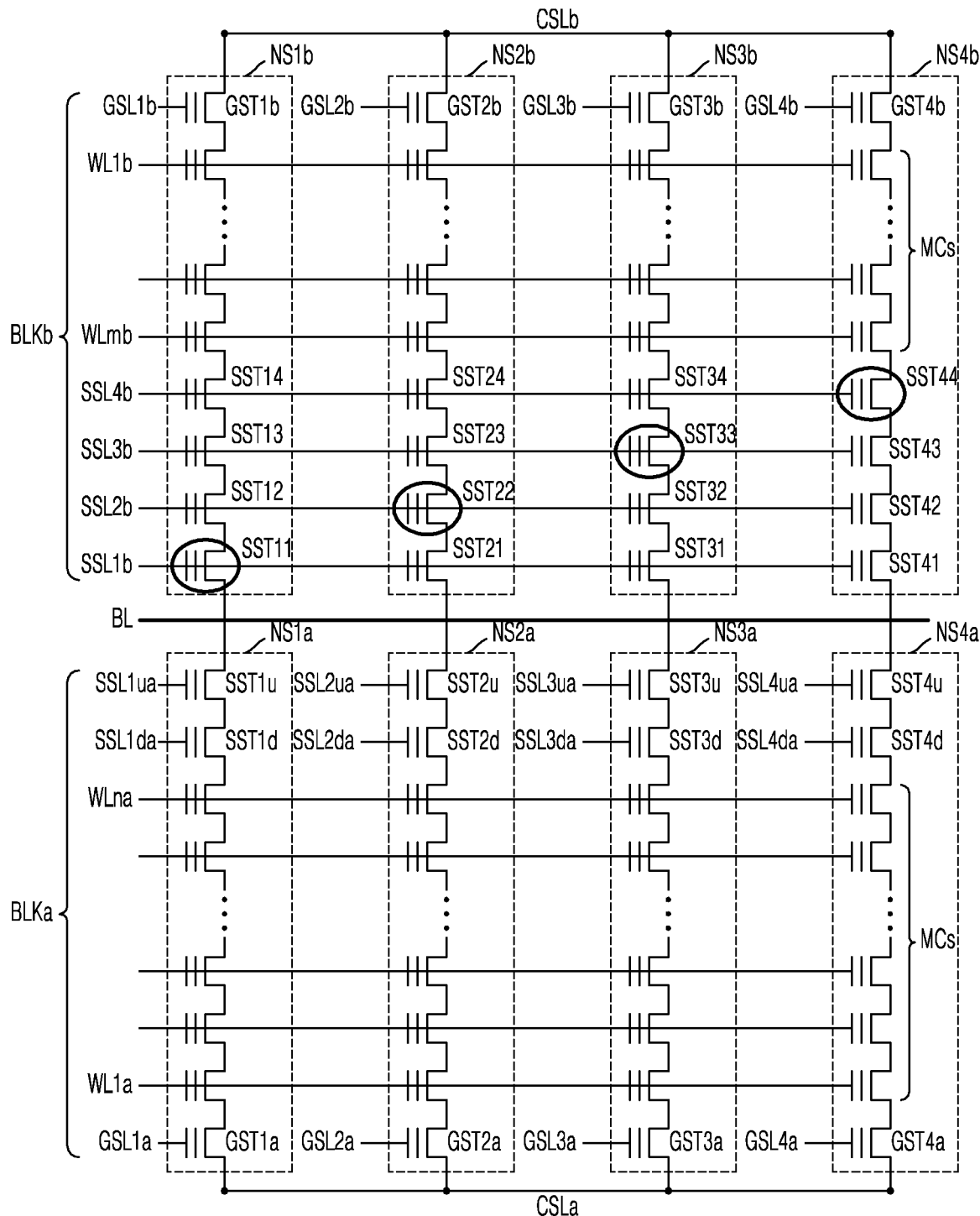
FIG. 6 is an equivalent circuit diagram of the 3D memory device of FIG. 5.

FIG. 6 is an equivalent circuit diagram of the 3D memory device 200 of FIG. 5.

Referring to FIGS. 5 and 6, the first memory block BLKa includes the NAND strings NS1a through NS4a respectively corresponding to the first vertical channel structures VC1a through VC4a. For example, the NAND string NS1a may include a ground selection transistor GST1a connected to the first ground selection line GSL1a, a plurality of memory cells MCs respectively connected to the word lines WL1a through WLna, a first lower string selection transistor SST1d connected to the first lower string selection line SSL1da, and a first upper string selection transistor SST1u connected to the first upper string selection line SSL1ua.

The second memory block BLKb includes the NAND strings NS1b through NS4b respectively corresponding to the second vertical channel structures VC1b through VC4b. For example, the NAND string NS1b may include first through fourth string selection transistors SST11 through SST14 respectively ("each") connected to the first through fourth string selection lines SSL1b through SSL4b and the bit line BL, a plurality of memory cells MCs respectively connected to the word lines WL1b through WLmb, and a ground selection transistor GST1b connected to the first ground selection line GSL1b. Furthermore, the first through fourth string selection transistors SST11 through ST14 may be included in one second vertical channel structure VC1b and may be connected to separate respective string selection lines SSL1b through SSL4b and may have different threshold voltages from each other.

In some example embodiments, the first through fourth lower string selection lines SSL1da through SSL4da and the first through fourth upper string selection lines SSL1ua through SSL4ua may each have a normal line shape. Accordingly, in the first memory block BLKa, first through fourth lower string selection transistors SST1d through SST4d located at the same level may respectively connected to the first through fourth lower string selection lines SSL1da through SSL4da, and first through fourth upper string selection transistors SST1u through SST4u located at the same level may respectively connected to the first through fourth upper string selection lines SSL1ua through SSL4ua. Accordingly, one of the NAND strings NS1a through NS4a may be selected by controlling voltages applied to the first through fourth lower string selection lines SSL1da through SSL4da and first through fourth upper string selection lines SSL1ua through SSL4ua.

In some example embodiments, the first through fourth lower string selection transistors SST1d through SST4d and the first through fourth upper string selection transistors SST1u through SST4u are located in an upper portion of the first memory block BLKa and may thus be formed before the bit line BL is formed. Accordingly, threshold voltages of the first through fourth lower string selection transistors SSL1d through SSL4d and first through fourth upper string selection transistors SSL1u through SSL4u may be controlled through an ion-implantation process before the bit line BL is formed.

In some example embodiments, the threshold voltages of the first through fourth upper string selection transistors SST1u through SST4u may be higher than those of the first through fourth lower string selection transistors SST1d through SST4d. For example, the first upper string selection transistor SST1u may have a first threshold voltage Vth1, and the first lower string selection transistor SST1d may have a second threshold voltage Vth2 that is less than the first threshold voltage Vth1. Accordingly, for example, in a program operation on the NAND string NS1a, the first upper string selection transistor SST1u may not be strongly turned on. Therefore, a channel voltage of the first vertical channel structure VC1a may be normally boosted, so that programming efficiency may be increased.

In some example embodiments, each of the first through fourth string selection lines SSL1b through SSL4b may each have a plate shape, and therefore, string selection transistors located at the same level may be connected in common to a single string selection line. Accordingly, in the second memory block BLKb, one of the NAND strings NS1b through NS4b may not be selected only by controlling voltages applied to the first through fourth string selection lines SSL1b through SSL4b. According to some example embodiments of the inventive concepts, one of the NAND strings NS1b through NS4b may be selected by controlling voltages applied to the first through fourth string selection lines SSL1b through SSL4b and threshold voltages of first through fourth string selection transistors SST11 through SST44.

In detail, in the second memory block BLKb, string selection transistors located at the same level may be connected in common to a single string selection line and may have different threshold voltages from each other. In detail, at least one of the threshold voltages of the first string selection transistors SST11 through SST41 connected to the first string selection line SSL1b may be different from the other threshold voltage. Restated, for example the first string selection transistors SST11 and SST21 may each be connected to the bit line BL and the first string selection line SSL1b and may have ("may be associated with") different threshold voltages from each other. For example, the first string selection transistor SST11 may have a first threshold voltage Vth1 and the first string selection transistors SST21 through SST41 may have a second threshold voltage Vth2, which is lower than the first threshold voltage Vth1. The second threshold voltage Vth2 may correspond to an erase voltage.

In addition, in the second memory block BLKb, string selection transistors included in one NAND string, which may be offset in the vertical direction VD with respect to each other, may be respectively connected to different string selection lines and may have different threshold voltages from each other. In detail, at least one of the threshold voltages of the first through fourth string selection transistors SST11 through SST14 included in the NAND string NS1b may be different from the other threshold voltages. Restated, the first through fourth string selection transistors SST11 through SST14 included in the NAND string NS1b may have ("may be associated with") different threshold voltages from each other. For example, the first string selection transistor SST11 may have the first threshold voltage Vth1 and the second through fourth string selection transistors SST12 through SST14 may have the second threshold voltage Vth2, which is lower than the first threshold voltage Vth1. The second threshold voltage Vth2 may correspond to the erase voltage. In another example, the first and second string selection transistors SST11 and SST22 may have the first threshold voltage Vth1 and the first and second string selection transistors SST21 and SST12 may have the second threshold voltage Vth2 which is lower ("less," "smaller in magnitude," or the like) than the first threshold voltage Vth1.

In some example embodiments, the first through fourth string selection transistors SST11 through SST44 are located in a lower portion of the second memory block BLKb, and therefore, the threshold voltages may not be easily controlled through an ion-implantation process. Accordingly, the threshold voltages of the first through fourth string selection transistors SST11 through SST44 may be electrically controlled through programming. For example, the first through fourth string selection transistors SST11, SST22, SST33, and SST44 may be programmed to have the first threshold voltage Vth1, and the other string selection transistors SST21 through SST41, SST12, SST32, SST42, SST13, SST23, SST43, and SST14 through SST34 may be erased.

In some example embodiments, the number ("quantity") of string selection transistors SST11 through SST44 included in the second memory block BLKb may be greater than the number of string selection transistors SST1d through SST4d and SST1u through SST4u included in the first memory block BLKa. Since the string selection transistors SST1d through SST4d and SST1u through SST4u are located in upper portions of the first vertical channel structures VC1a through VC4a and the string selection transistors SST11 through SST44 are located in lower portions of the second vertical channel structures VC1b through VC4b, the size of channel holes corresponding to the string selection transistors SST11 through SST44 may be smaller than the size of channel holes corresponding to the string selection transistors SST1d through SST4d and SST1u through SST4u. The smaller the size of channel holes, coupling between adjacent string selection lines may increase. Accordingly, to control the coupling, the second memory block BLKb may include more string selection transistors SST11 through SST44 than the first memory block BLKa.

In some example embodiments, the number of ground selection transistors GST1b through GST4b included in the second memory block BLKb may be the same as the number of ground selection transistors GST1a through GST4a included in the first memory block BLKa, but the inventive concepts are not limited thereto. In some example embodiments, the number of ground selection transistors GST1b through GST4b included in the second memory block BLKb may be greater than the number of ground selection transistors GST1a through GST4a included in the first memory block BLKa. Since the ground selection transistors GST1a through GST4a are located in lower portions of the first vertical channel structures VC1a through VC4a and the ground selection transistors GST1b through GST4b are located in upper portions of the second vertical channel structures VC1b through VC4b, the size of channel holes corresponding to the ground selection transistors GST1a through GST4a may be smaller than the size of channel holes corresponding to the ground selection transistors GST1b through GST4b. In some example embodiments, the number ("quantity") of word lines WL1b through WLmb included in the second memory block BLKb may be greater than the number ("quantity") of word lines WL1a through WLna included in the first memory block BLKa.

FIG. 7A shows an example of read bias conditions for the first memory block BLKa of FIG. 5, according to some example embodiments of the inventive concepts.

Referring to FIG. 7A, to perform a read operation on the first memory block BLKa, a voltage V_GSLa_sel applied to a selected ground selection line may be a read bias voltage Vread for turning on a ground selection transistor. A voltage V_SSLda_sel applied to a selected lower string selection line and a voltage V_SSLua_sel applied to a selected upper string selection line may be a first bias voltage V1 for turning on a lower ground selection transistor and an upper ground selection transistor. A voltage V_SSLda_unsel applied to an unselected lower string selection line and a voltage V_SSLua_unsel applied to an unselected upper string selection line may be a second bias voltage V2, which is lower than the first bias voltage V1. A voltage V_WLa_sel applied to a selected word line may be a selection voltage Vsel and a voltage V_WLa_unsel applied to an unselected word line may be the read bias voltage Vread, which is higher than the selection voltage Vsel.

Figure 8:
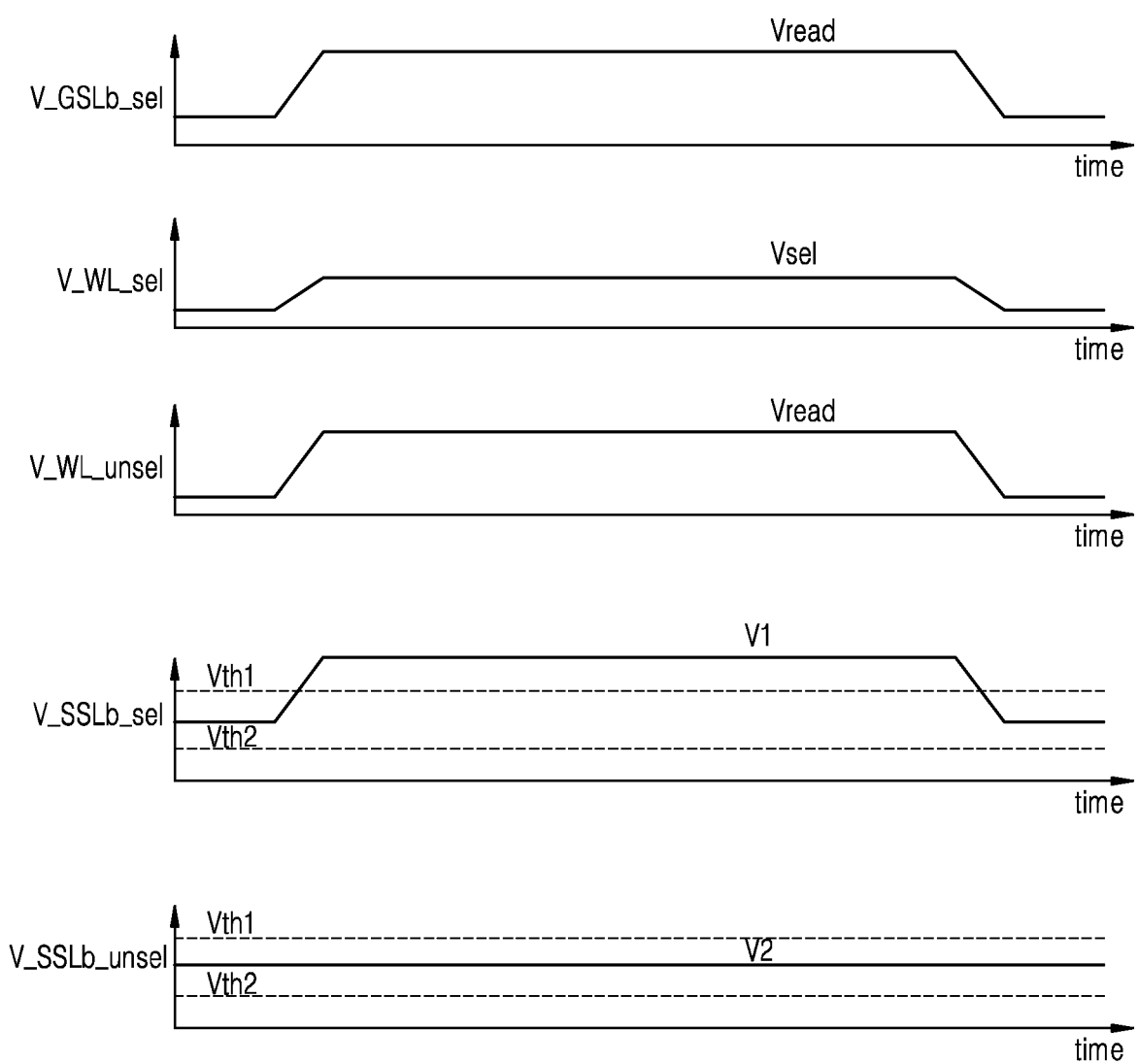
FIG. 8 shows graphs of the read bias conditions of FIG. 7B.

FIG. 7B shows an example of read bias conditions for the second memory block BLKb of FIG. 5, according to some example embodiments of the inventive concepts. FIG. 8 shows graphs of the read bias conditions of FIG. 7B.

Referring to FIGS. 7B and 8, to perform a read operation on the second memory block BLKb, a voltage V_GSLb_sel applied to a selected ground selection line may be the read bias voltage Vread for turning on a ground selection transistor. A voltage V_WLb_sel applied to a selected word line may be the selection voltage Vsel and a voltage V_WLb_unsel applied to an unselected word line may be the read bias voltage Vread, which is higher than the selection voltage Vsel.

Accordingly, memory device 100 may be configured to apply a first bias voltage V1 to a first string selection line SSL1b, where the first bias voltage is greater than a first threshold voltage Vth1 of, for example, at least a first string selection transistor SST11, and the memory device 100 may be further configured to apply a second bias voltage V2 to the second string selection line SSL2b such that one of, for example, the first string selection transistors SST11 and SST21 connected to the first string selection line SSL1b is selected, where the second bias voltage V2 is greater than the second threshold voltage Vth2 of, for example, at least the first string selection transistor SST21 and less than the first threshold voltage Vth1.

A voltage V_SSLb_sel applied to a selected string selection line may be the first bias voltage V1, which is higher than the first threshold voltage Vth1. For example, the first threshold voltage Vth1 may be 2 V and the first bias voltage V1 may be about 4 V to about 6 V. A voltage V_SSLb_unsel applied to an unselected string selection line may be the second bias voltage V2, which is higher than the second threshold voltage Vth2 and lower than the first threshold voltage Vth1. For example, the second threshold voltage Vth2 may be −2 V and the second bias voltage V2 may be 0 V.

Since the first and second bias voltages V1 and V2 are higher than the second threshold voltage Vth2, the string selection transistors SST21 through SST41, SST12, SST32, SST42, SST13, SST23, SST43, and SST14 through SST34 having the second threshold voltage Vth2 may be turned on. However, since the second bias voltage V2 is lower than the first threshold voltage Vth1, only a string selection transistor which the first bias voltage V1 is applied to among the string selection transistors SST11, SST22, SST33, and SST44 having the first threshold voltage Vth1 may be turned on.

Figure 9:
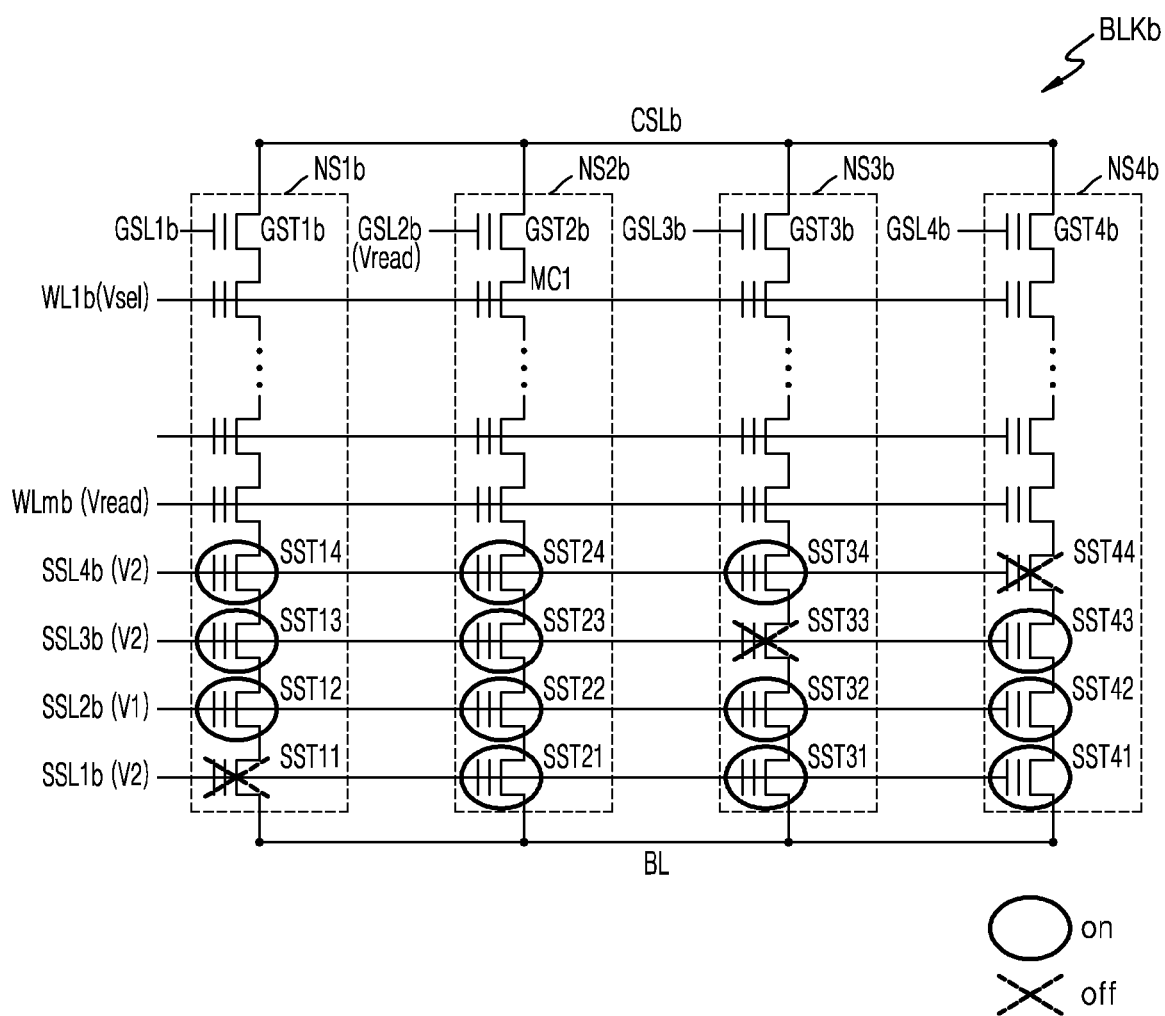
FIG. 9 shows an example of a read operation on a second memory block under the read bias conditions of FIG. 8.

FIG. 9 shows an example of a read operation on the second memory block BLKb under the read bias conditions of FIG. 8.

Referring to FIG. 9, a case where a read operation is performed on a memory cell MC1 included in the NAND string NS2b corresponding to the second vertical channel structure VC2b in the second memory block BLKb will be described. At this time, the selected ground selection line is the second ground selection line GSL2b, the selected word line is the word line WL1b, and the other word lines are unselected. The selected string selection line is the second string selection line SSL2b and the first, third, and fourth string selection lines SSL1b, SSL3b, and SSL4b are unselected.

Since the first bias voltage V1 is applied to the selected second string selection line SSL2b, the second string selection transistors SST12 through SST42 connected in common to the second string selection line SSL2b may be turned on. Meanwhile, since the second bias voltage V2 is applied to the unselected first, third, and fourth string selection lines SSL1*b*, SSL3*b*, and SSL4*b*, the first, third, and fourth string selection transistors SST11, SST33, and SST44 having the first threshold voltage Vth1 are turned off. Accordingly, among the NAND strings NS1*b* through NS4*b* included in the second memory block BLKb, the NAND string NS2*b* may be selected.

Figures 10A, 10B, 11:
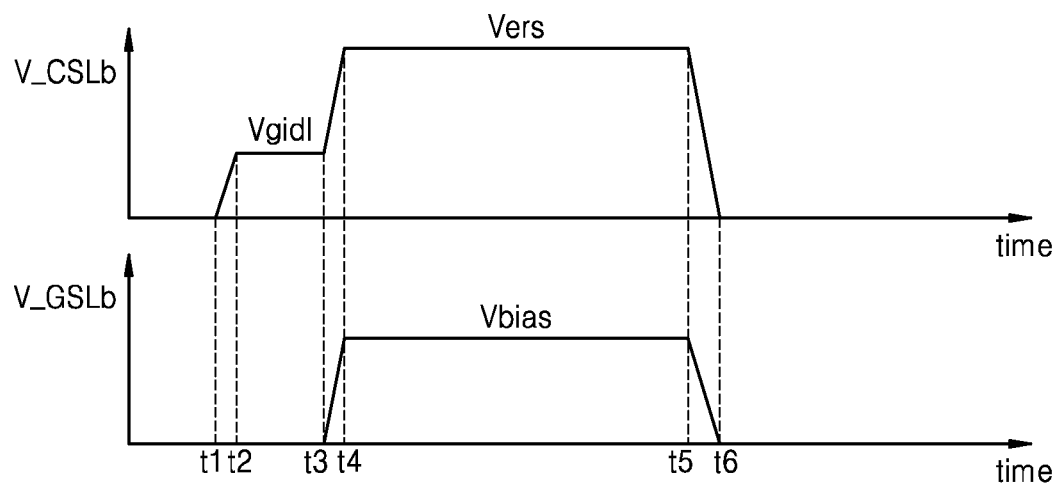
FIGS. 10A and 10B show examples of erase bias conditions for the first and second memory blocks of FIG. 5, according to some example embodiments of the inventive concepts.
FIG. 11 shows graphs of the erase bias conditions of FIG. 10B.

FIG. 10A shows an example of erase bias conditions for the first memory block BLKa of FIG. 5, according to some example embodiments of the inventive concepts.

Referring to FIG. 10A, to perform an erase operation on the first memory block BLKa, a voltage V_SUB applied to the substrate SUB, and more particularly, to an active region, e.g., a P-well region, of the substrate SUB may be an erase voltage Vers, which may be, for example, 20 V. Accordingly, the first memory block BLKa will be understood to include a plurality of memory cells that are configured to be erased based on application of an erase voltage Vers to the substrate SUB. A voltage V_WLa applied to word lines may be a word line erase voltage Vwe, which may be, for example, 0 V. At this time, ground selection lines GSLa, lower string selection lines SSLda, upper string selection lines SSLua, and the bit line BL may be floated. As such, the first memory block BLKa may be erased by bulk erasing using a voltage applied to the substrate SUB.

FIG. 10B shows an example of erase bias conditions for the second memory block BLKb of FIG. 5, according to some example embodiments of the inventive concepts. FIG. 11 shows graphs of the erase bias conditions of FIG. 10B.

Referring to FIGS. 10B and 11, to perform an erase operation on the second memory block BLKb, a common source line voltage V_CSLb applied to the common source line CSLb may start to rise to a gate induced drain leakage (GIDL) voltage Vgidl at a first time t1 and be maintained at the GIDL voltage Vgidl during a period from a second time t2 to a third time t3. For example, the GIDL voltage Vgidl may be 8 V. Thereafter, the common source line voltage V_CSLb may start to rise to the erase voltage Vers at the third time t3 and be maintained at the erase voltage Vers during a period from a fourth time t4 to a fifth time t5. For example, the erase voltage Vers may be 20 V. Thereafter, the common source line voltage V_CSLb may start to drop at the fifth time t5 to, for example, 0 V.

When the common source line voltage V_CSLb is maintained at the GIDL voltage Vgidl, holes are generated at the source edges of ground selection transistors (e.g., GST1*b* through GST4*b* of FIG. 6), and therefore, a channel is charged from an end of the common source line CSLb of NAND strings (e.g., NS1*b* through NS4*b* of FIG. 6). The GIDL voltage Vgidl may have a level which is equal to or higher than a level of a minimum voltage for generating GIDL. When the common source line voltage V_CSLb rises to the erase voltage Vers, the channel is continuously charged from the end of the common source line CSLb.

Meanwhile, a ground selection line voltage V_GSLb applied to ground selection lines GSLb may start to rise to a bias voltage Vbias at the third time t3 and be maintained at the bias voltage Vbias during the period from the fourth time t4 to the fifth time t5. At this time, the bias voltage Vbias may be lower than the erase voltage Vers by a predetermined voltage level. For example, the bias voltage Vbias may be 12 V. Thereafter, the ground selection line voltage V_GSLb may start to drop at the fifth time t5 to, for example, 0 V.

During the period from the second time t2 to the third time t3, the common source line voltage V_CSLb may be maintained at the GIDL voltage Vgidl and the ground selection line voltage V_GSLb may be 0 V. At this time, pairs of electrons and holes may be generated in the vicinity of the junction region of the common source line CSLb. The electrons may gather at the end of the common source line CSLb, to which a high voltage is applied, and the holes may drift to the channel so as to charge the channel, and therefore, the channel may be boosted nearly up to the GIDL voltage Vgidl. During the period from the fourth time t4 to the fifth time t5, the common source line voltage V_CSLb may be maintained at the erase voltage Vers and the ground selection line voltage V_GSLb may be maintained at the bias voltage Vbias. At this time, pairs of electrons and holes may be continuously generated and the channel may be charged to a higher potential.

A voltage V_WLb applied to word lines may be the word line erase voltage Vwe, which may be, for example, 0 V. At this time, string selection lines SSLb and the bit line BL may be floated. As such, the second memory block BLKb may be erased due to the GIDL by a voltage applied to the common source line CSLb. Accordingly, it will be understood that the second memory block BLKb may include a separate plurality of memory cells that are configured to be erased based on application of an erase voltage Vers to the common source line CSLb.

Figures 12A, 12B, 13:
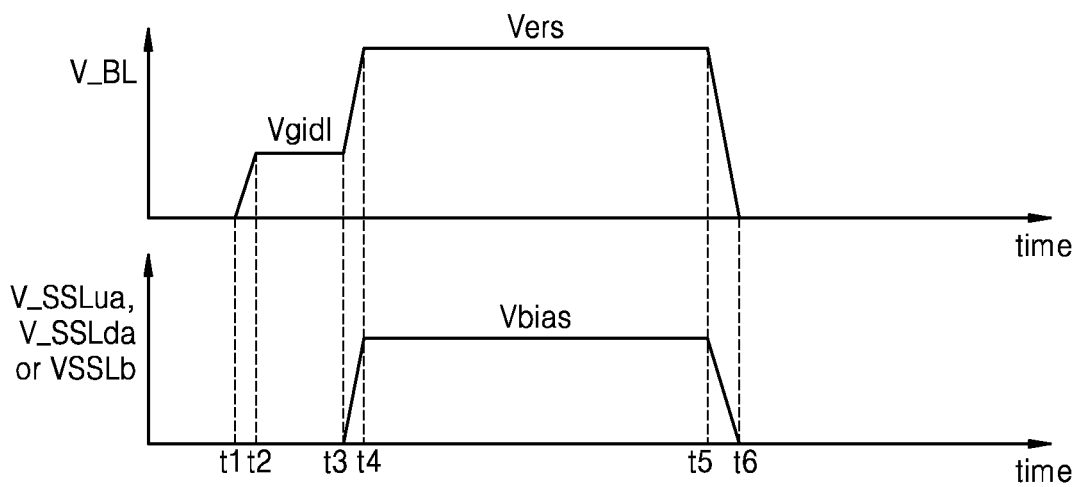
FIGS. 12A and 12B show other examples of the erase bias conditions for the first and second memory blocks of FIG. 5, according to some example embodiments of the inventive concepts.
FIG. 13 shows graphs of the erase bias conditions of FIGS. 12A and 12B.

FIG. 12A shows another example of the erase bias conditions for the first memory block BLKa of FIG. 5, according to some example embodiments of the inventive concepts. FIG. 13 shows graphs of the erase bias conditions of FIGS. 12A and 12B.

Referring to FIGS. 12A and 13, to perform an erase operation on the first memory block BLKa, a bit line voltage V_BL applied to the bit line BL may start to rise to the GIDL voltage Vgidl at the first time t1 and be maintained at the GIDL voltage Vgidl during the period from the second time t2 to the third time t3. Thereafter, the bit line voltage V_BL may start to rise to the erase voltage Vers at the third time t3 and be maintained at the erase voltage Vers during the period from the fourth time t4 to the fifth time t5. Thereafter, the bit line voltage V_BL may start to drop at the fifth time t5 to, for example, 0 V. When the bit line voltage V_BL is maintained at the GIDL voltage Vgidl, holes are generated at the drain edges of string selection transistors (e.g., SST1*u* through SST4*u* of FIG. 6), and therefore, a channel is charged from an end of the bit line BL of NAND strings (e.g., NS1*a* through NS4*a* of FIG. 6). When the bit line voltage V_BL rises to the erase voltage Vers, the channel is continuously charged from the end of the bit line BL.

Meanwhile, string selection line voltages V_SSLua and V_SSLda respectively applied to string selection lines SSLua and SSLda may start to rise to the bias voltage Vbias at the third time t3 and be maintained at the bias voltage Vbias during the period from the fourth time t4 to the fifth time t5. At this time, the bias voltage Vbias may be lower than the erase voltage Vers by a predetermined voltage level. Thereafter, the string selection line voltages V_SSLua and V_SSLda may start to drop at the fifth time t5 to, for example, 0 V.

During the period from the second time t2 to the third time t3, the bit line voltage V_BL may be maintained at the GIDL voltage Vgidl and the string selection line voltages V_SSLua and V_SSLda may be 0 V. At this time, pairs of electrons and holes may be generated in the vicinity of the junction region of the bit line BL. The electrons may gather at the end of the bit line BL, to which a high voltage is applied, and the holes may drift to the channel so as to charge the channel, and therefore, the channel may be boosted nearly up to the GIDL voltage Vgidl. During the period from the fourth time t4 to the fifth time t5, the bit line voltage V_BL may be maintained at the erase voltage Vers and the string selection line voltages V_SSLua and V_SSLda may be maintained at the bias voltage Vbias. At this time, pairs of electrons and holes may be continuously generated and the channel may be charged to a higher potential.

The voltage V_WLa applied to word lines may be the word line erase voltage Vwe, which may be, for example, 0 V. At this time, the ground selection lines GSLa and the common source line CSLa may be floated. As such, the first memory block BLKa may be erased due to the GIDL by a voltage applied to the bit line BL.

According to some example embodiments, including the example embodiments shown in FIG. 12A, when the erase voltage Vers is applied to the bit line BL, erasing may be performed on the first memory block BLKa due to GIDL. However, the inventive concepts are not limited thereto. In some example embodiments, when the erase voltage Vers is applied to the bit line BL and the common source line CSLa, erasing may be performed on the first memory block BLKa due to GIDL. At this time, a voltage applied to the bit line BL and the common source line CSLa may rise to the GIDL voltage Vgidl and be maintained at the GIDL voltage Vgidl and may then rise to the erase voltage Vers and be maintained at the erase voltage Vers. At this time, the bias voltage Vbias may be applied to the ground selection lines GSLa and the string selection lines SSLua and SSLda.

FIG. 12B shows another example of the erase bias conditions for the second memory block BLKb of FIG. 5, according to some example embodiments of the inventive concepts.

Referring to FIGS. 12B and 13, to perform an erase operation on the second memory block BLKb, the bit line voltage V_BL applied to the bit line BL may start to rise to the GIDL voltage Vgidl at the first time t1 and be maintained at the GIDL voltage Vgidl during the period from the second time t2 to the third time t3. Thereafter, the bit line voltage V_BL may start to rise to the erase voltage Vers at the third time t3 and be maintained at the erase voltage Vers during the period from the fourth time t4 to the fifth time t5. When the bit line voltage V_BL is maintained at the GIDL voltage Vgidl, holes are generated at the drain edges of string selection transistors (e.g., SST11 through SST41 of FIG. 6), and therefore, a channel is charged from an end of the bit line BL of NAND strings (e.g., NS1b through NS4b of FIG. 6). When the bit line voltage V_BL rises to the erase voltage Vers, the channel is continuously charged from the end of the bit line BL.

Meanwhile, a string selection line voltage V_SSLb applied to the string selection lines SSLb may start to rise to the bias voltage Vbias at the third time t3 and be maintained at the bias voltage Vbias during the period from the fourth time t4 to the fifth time t5. The voltage V_WLb applied to word lines may be the word line erase voltage Vwe, which may be, for example, 0 V. At this time, the ground selection lines GSLb and the common source line CSLb may be floated. As such, the second memory block BLKb may be erased due to the GIDL by a voltage applied to the bit line BL.

According to some example embodiments, including the example embodiments shown in FIG. 12B, when the erase voltage Vers is applied to the bit line BL, erasing may be performed on the second memory block BLKb due to GIDL. However, the inventive concepts are not limited thereto. In some example embodiments, when the erase voltage Vers is applied to the bit line BL and the common source line CSLb, erasing may be performed on the second memory block BLKb due to GIDL. At this time, a voltage applied to the bit line BL and the common source line CSLb may rise to the GIDL voltage Vgidl and be maintained at the GIDL voltage Vgidl and then rise to the erase voltage Vers and be maintained at the erase voltage Vers. At this time, the bias voltage Vbias may be applied to the ground selection lines GSLb and the string selection lines SSLb.

In view of at least the above, it will be understood that the first memory block BLKa and the second memory block BLKb may each include a separate plurality of memory cells that are configured to be erased based on application of an erase voltage Vers to the bit line BL.

FIG. 14A shows an example of program bias conditions for the first memory block BLKa of FIG. 5, according to some example embodiments of the inventive concepts.

Referring to FIG. 14A, to perform a program operation on the first memory block BLKa, a voltage V_CSLa applied to the common source line CSLa may be a first common source selection voltage Vca, which may be, for example, 2 V. A voltage V_GSLa applied to the ground selection lines GSLa may be a first ground selection voltage Vga, which may be, for example, 0.3 V. Accordingly, the memory device 100 will be understood to be configured to apply a first ground selection voltage Vga to at least the ground selection lines GSLa (e.g., first ground selection lines GSL1a through GSL4a) in accordance with a program operation on the first memory block BLKa. Furthermore, the memory device 100 will be understood to be configured to apply a first common source selection voltage Vca to the common source line CSLa during a program operation on the first memory block BLKa.

The voltage V_SSLda_sel applied to a selected lower string selection line and the voltage V_SSLua_sel applied to a selected upper string selection line may be the first bias voltage V1. The voltage V_SSLda_unsel applied to an unselected lower string selection line and the voltage V_SSLua_unsel applied to an unselected upper string selection line may be the second bias voltage V2, which is lower than the first bias voltage V1. The bit line voltage V_BL applied to the bit line BL may be 0 V. The voltage V_WLa_sel applied to a selected word line may be a program voltage Vpgm. The voltage V_WLa_unsel applied to an unselected word line may be a pass voltage Vpass.

In some example embodiments, memory cells included in the first memory block BLKa may be programmed in a direction from the bit line BL toward the substrate SUB. The size of a channel hole of each of the first vertical channel structures VC1a through VC4a may decrease away from the bit line BL toward the substrate SUB. At this time, the memory cells may be configured to be sequentially programmed in descending order of the size of channel holes. In other words, the memory cells included in the first memory block BLKa may be configured to be sequentially programmed starting from a memory cell close ("proximate") to the bit line BL to a memory cell far ("distal") from the bit line BL. For example, in the NAND string NS1a, memory cells may be sequentially programmed in a direction from the first lower string selection line SSL1da toward the first ground selection line GSL1a.

FIG. 14B shows an example of program bias conditions for the second memory block BLKb of FIG. 5, according to some example embodiments of the inventive concepts.

Referring to FIG. 14B, to perform a program operation on the second memory block BLKb, the voltage V_CSLb applied to the common source line CSLb may be a second common source selection voltage Vcb. The second common source selection voltage Vcb may be lower than the first common source selection voltage Vca and may be, for example, 0 V. The voltage V_GSLb applied to the ground selection lines GSLb may be a second ground selection voltage Vgb. The second ground selection voltage Vgb may be lower than the first ground selection voltage Vga and may be, for example, 0 V. Accordingly, the memory device 100 will be understood to be configured to apply a second ground selection voltage Vgb to at least the ground selection lines GSLb (e.g., second ground selection lines GSL1b through GSL4b) in accordance with a program operation on the second memory block BLKb. Furthermore, the memory device 100 will be understood to be configured to apply a second common source selection voltage Vcb to the common source line CSLb during a program operation on the second memory block BLKb. The first common source selection voltage Vca may be greater than the second common source selection voltage Vcb.

The voltage V_SSLb_sel applied to a selected string selection line may be the first bias voltage V1. The voltage V_SSLb_unsel applied to an unselected string selection line may be the second bias voltage V2, which is lower than the first bias voltage V1. The bit line voltage V_BL applied to the bit line BL may be 0 V. The voltage V_WLb_sel applied to a selected word line may be the program voltage Vpgm. The voltage V_WLb_unsel applied to an unselected word line may be the pass voltage Vpass.

In some example embodiments, memory cells included in the second memory block BLKb may be programmed in a direction from the common source line CSLb toward the bit line BL. The size of a channel hole of each of the second vertical channel structures VC1b through VC4b may decrease away from the common source line CSLb toward the bit line BL. At this time, the memory cells may be configured to be sequentially programmed in descending order of the size of channel holes. In other words, the memory cells included in the second memory block BLKb may be configured to be sequentially programmed starting from a memory cell far ("distal") from the bit line BL to a memory cell close ("proximate") to the bit line BL.

Figure 15:
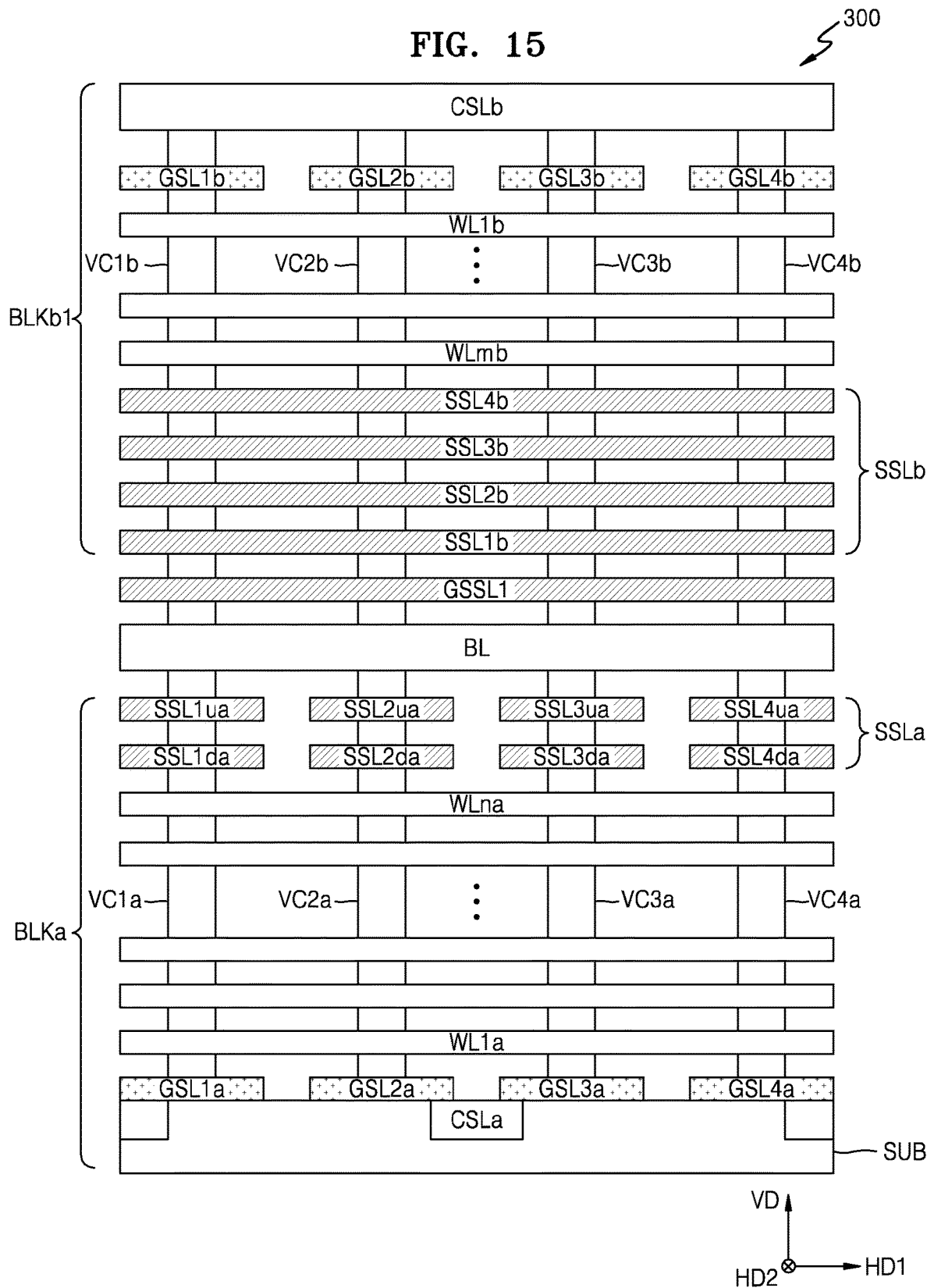
FIG. 15 is a cross-sectional view of a 3D memory device according to some example embodiments of the inventive concepts.

FIG. 15 is a cross-sectional view of a 3D memory device 300 according to some example embodiments of the inventive concepts.

Referring to FIG. 15, the 3D memory device 300 may include the first memory block BLKa, a second memory block BLKb1, and the bit line BL. The 3D memory device 300 may be a modification of the 3D memory device 200 of FIG. 5. For example, the first memory block BLKa may correspond to the first memory block BLKa of FIG. 5 and the second memory block BLKb1 may correspond to a modification of the second memory block BLKb of FIG. 5. The descriptions made with reference to FIGS. 5 through 14B may refer to the example embodiments shown in FIG. 15.

In detail, the second memory block BLKb1 may further include a global string selection line GSSL1 compared to the second memory block BLKb of FIG. 5. The global string selection line GSSL1 may extend in the first horizontal direction HD1. In some example embodiments, a length of the global string selection line GSSL1 in the first horizontal direction HD1 may be less than a length of the first through fourth string selection lines SSL1b through SSL4b in the first horizontal direction HD1.

Figure 16:
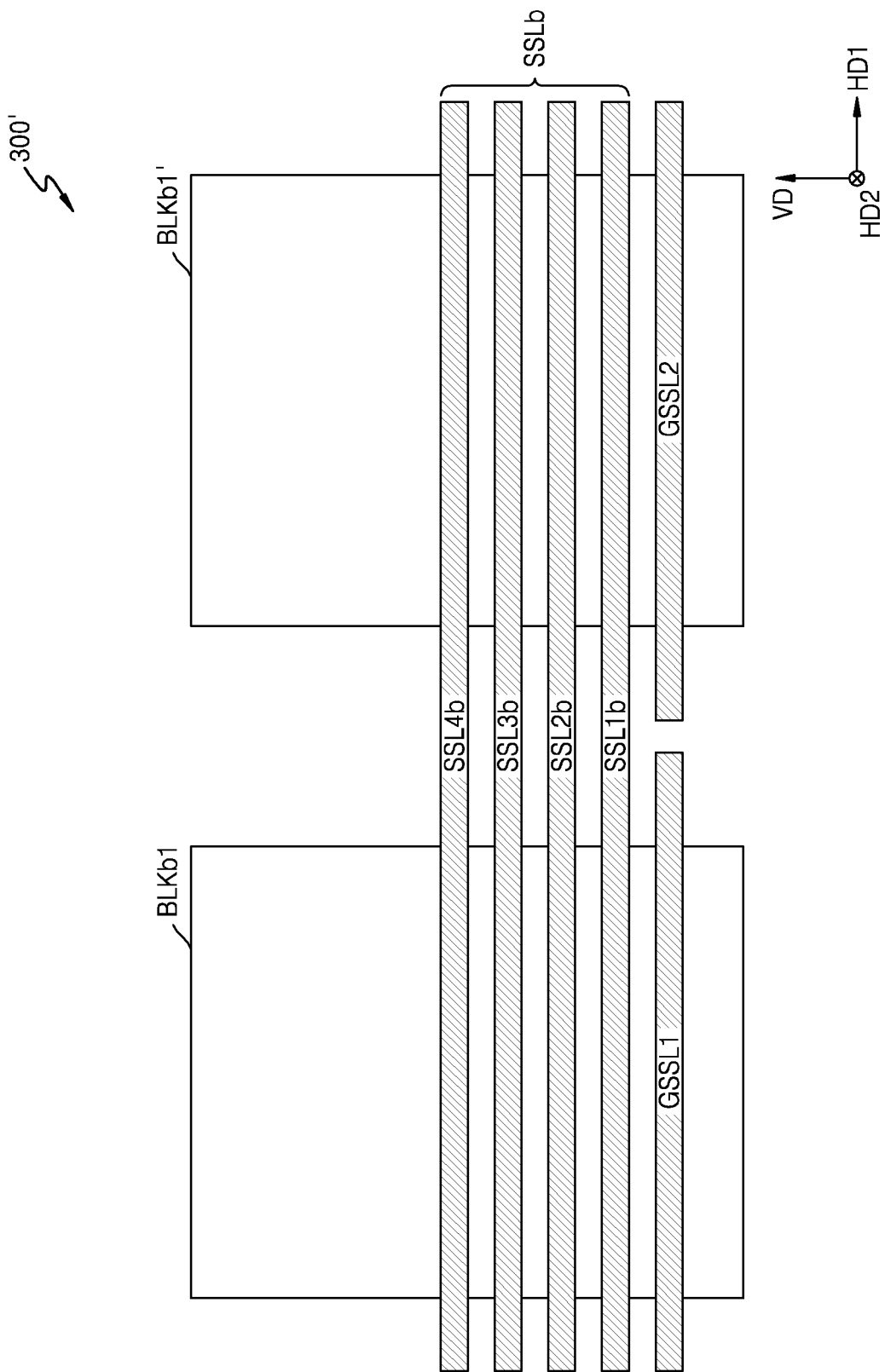
FIG. 16 shows an exemplary implementation of the 3D memory device of FIG. 15.

FIG. 16 shows a 3D memory device 300' as an example of the 3D memory device 300 of FIG. 15. For convenience's sake, only some elements of upper memory blocks included in the 3D memory device 300' are shown in FIG. 16.

Referring to FIG. 16, the 3D memory device 300' may include the second memory block BLKb1 and a third memory block BLKb1'. The second and third memory blocks BLKb1 and BLKb1' may be adjacent to each other (e.g., offset) in the first horizontal direction HD1 and may be at a common position ("level") in the vertical direction VD, as shown in at least FIG. 16. The second memory block BLKb1 may include the global string selection line GSSL1 extending in the first horizontal direction HD1, and the third memory block BLKb1' may include a global string selection line GSSL2 extending in the first horizontal direction HD1. The first through fourth string selection lines SSL1b through SSL4b may extend across the second and third memory blocks BLKb_1 and BLKb1' in the first horizontal direction HD1. As shown in FIG. 16, the first and second global string selection lines GSSL1 and GSSL2 may be at a common or substantially common level in the vertical direction.

As described above, when the second and third memory blocks BLKb1 and BLKb1' respectively include the global string selection lines GSSL1 and GSSL2, the number of local string selection lines, i.e., the first through fourth string selection lines SSL1b through SSL4b, included in the 3D memory device 300' may be reduced, and therefore, the amount of coding for the first through fourth string selection lines SSL1b through SSL4b may also be reduced. As shown in FIG. 16, at least the first global string selection line GSSL1 is included in the second memory block BLKb1 between the bit line BL and at least the first and second string selection lines SSL1b and SSL2b, where at least the first and second string selection lines SSL1b and SSL2b each extend across (e.g., inclusively and continuously between) the second and third memory blocks BLKb1 and BLKb1'.

FIG. 17 shows an example of read bias conditions for the 3D memory device 300' of FIG. 16.

Referring to FIG. 17, the voltage V_WLb_sel applied to a selected word line, the voltage V_WLb_unsel applied to an unselected word line, the voltage V_SSLb_sel applied to a selected string selection line, and the voltage V_SSLb_unsel applied to an unselected string selection line may be the same between read bias conditions for the second memory block BLKb1 and read bias conditions for the third memory block BLKb1'.

When a read operation is performed on the second memory block BLKb1, a voltage V_GSSL1 applied to the global string selection line GSSL1 may be a turn-on voltage Von and a voltage V_GSSL2 applied to the global string selection line GSSL2 may be a turn-off voltage Voff. When a read operation is performed on the third memory block BLKb1', the voltage V_GSSL1 applied to the global string selection line GSSL1 may be the turn-off voltage Voff and the voltage V_GSSL2 applied to the global string selection line GSSL2 may be the turn-on voltage Von. As described above, a read operation may be selectively performed on the second and third memory blocks BLKb1 and BLKb1', which are adjacent to each other in the first horizontal direction HD1, by controlling a voltage applied to each of the global string selection lines GSSL1 and GSSL2.

Figure 18:
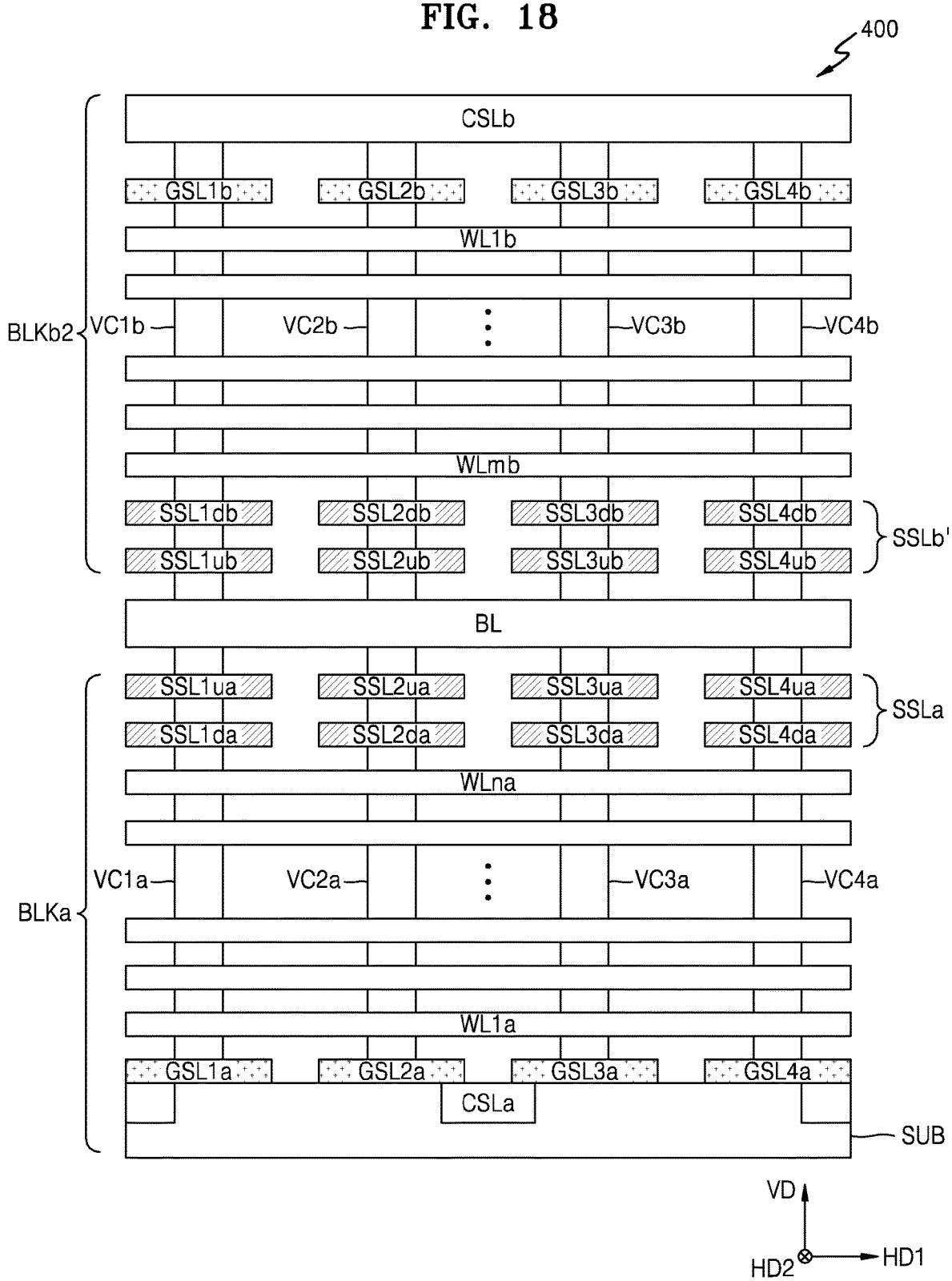
FIG. 18 is a cross-sectional view of a 3D memory device according to some example embodiments of the inventive concepts.

FIG. 18 is a cross-sectional view of a 3D memory device 400 according to some example embodiments of the inventive concepts.

Referring to FIG. 18, the 3D memory device 400 may include the first memory block BLKa, a second memory block BLKb2, and the bit line BL. The 3D memory device 400 may be a modification of the 3D memory device 200 of FIG. 5. For example, the first memory block BLKa may correspond to the first memory block BLKa of FIG. 5 and the second memory block BLKb2 may correspond to a modification of the second memory block BLKb of FIG. 5.

The descriptions made with reference to FIGS. 5 through 14B may refer to the example embodiments shown in FIG. 18.

In detail, the second memory block BLKb2 may include first through fourth lower string selection lines SSL1*db* through SSL4*db* and first through fourth upper string selection lines SSL1*ub* through SSL4*ub*. The first through fourth upper string selection lines SSL1*ub* through SSL4*ub* may extend in the second horizontal direction HD2 and each have a line shape. The first through fourth lower string selection lines SSL1*db* through SSL4*db* may also extend in the second horizontal direction HD2 and each have a line shape.

In some example embodiments, a threshold voltage of upper string selection transistors respectively connected to the first through fourth upper string selection lines SSL1*ub* through SSL4*ub* may be higher than a threshold voltage of lower string selection transistors respectively connected to the first through fourth lower string selection lines SSL1*db* through SSL4*db*. Accordingly, for example, when a program operation is performed on a NAND string corresponding to the second vertical channel structure VC1*b*, an upper string selection transistor adjacent to the bit line BL may not be strongly turned on. Therefore, a channel voltage of the second vertical channel structure VC1*b* may be normally boosted, so that programming efficiency may be increased.

Figure 19:
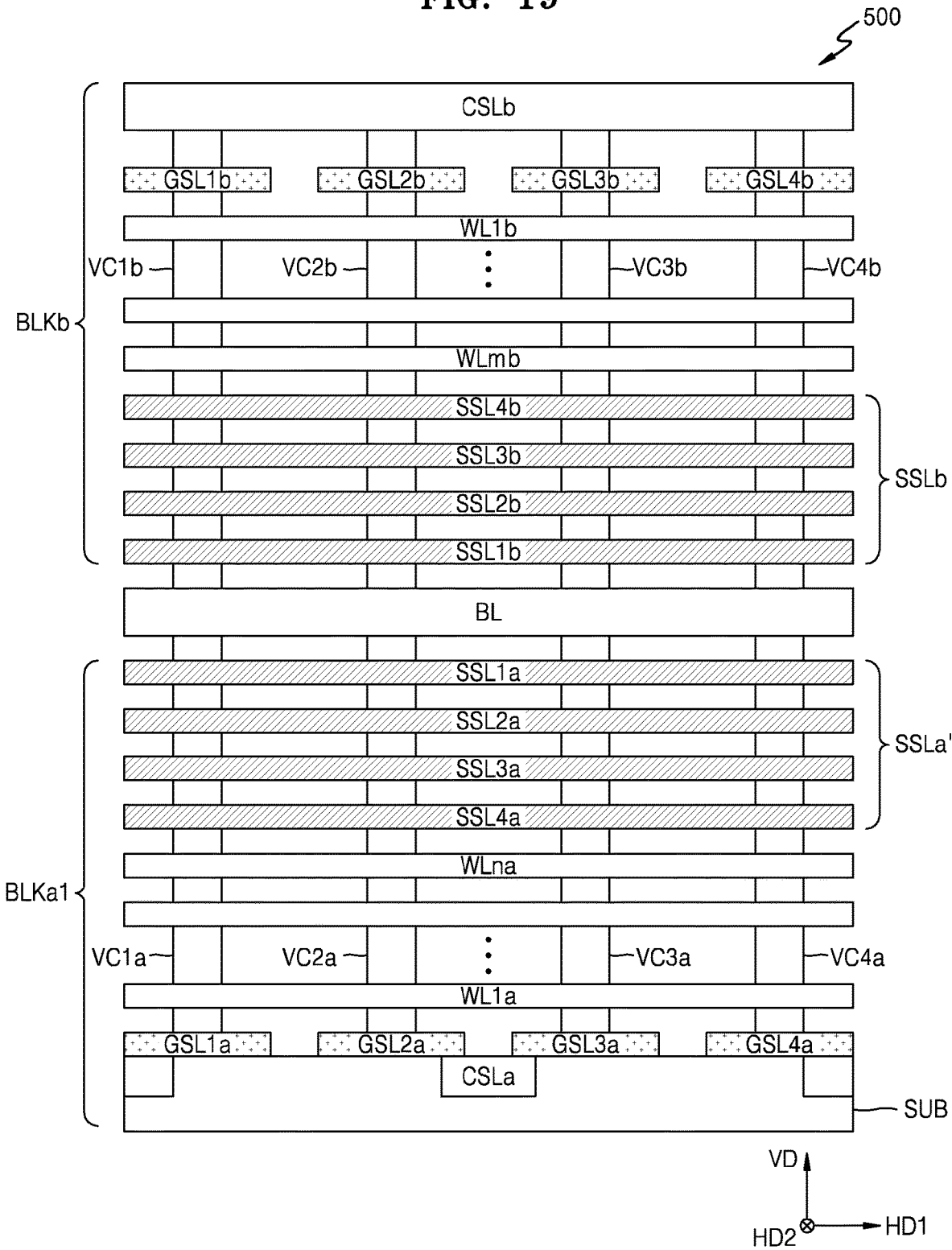
FIG. 19 is a cross-sectional view of a 3D memory device according to some example embodiments of the inventive concepts.

FIG. 19 is a cross-sectional view of a 3D memory device 500 according to some example embodiments of the inventive concepts.

Referring to FIG. 19, the 3D memory device 500 may include a first memory block BLKa1, the second memory block BLKb, and the bit line BL. The 3D memory device 500 may be a modification of the 3D memory device 200 of FIG. 5. For example, the first memory block BLKa1 may correspond to a modification of the first memory block BLKa of FIG. 5 and the second memory block BLKb may correspond to the second memory block BLKb of FIG. 5. The descriptions made with reference to FIGS. 5 through 14B may refer to the example embodiments shown in FIG. 19.

In detail, the first memory block BLKa1 may include first through fourth string selection lines SSL1*a* through SSL4*a*. The first through fourth string selection lines SSL1*a* through SSL4*a* may extend in the first horizontal direction HD1 and be parallel to one another in the vertical direction VD (e.g., "stacked" in the vertical direction VD, "offset" in the vertical direction VD, or the like). In some example embodiments, each of the first through fourth string selection lines SSL1*a* through SSL4*a* may each have a plate shape. Accordingly, in the first memory block BLKa1, string selection transistors located at the same level may be connected in common to a single string selection line.

In detail, in the first memory block BLKa1, string selection transistors located at the same level may be connected in common to a single string selection line and may have different threshold voltages from each other. In detail, at least one of threshold voltages of respective string selection transistors connected to the first string selection line SSL1*a* may be different from the other threshold voltages. For example, among the string selection transistors connected to the first string selection line SSL1*a*, a string selection transistor in the first vertical channel structure VC1*a* may have the first threshold voltage Vth1 and string selection transistors respectively in the other first vertical channel structures VC2*a* through VC4*a* may have the second threshold voltage Vth2, which is lower than the first threshold voltage Vth1. The second threshold voltage Vth2 may correspond to an erase voltage.

In addition, in the first memory block BLKa1, string selection transistors in one NAND string may be respectively connected to different string selection lines and have different threshold voltages from each other. In detail, at least one of threshold voltages of respective string selection transistors in the first vertical channel structure VC1*a* may be different from the other threshold voltages. For example, a string selection transistor connected to the first string selection line SSL1*a* may have the first threshold voltage Vth1, and string selection transistors respectively connected to the second through fourth string selection lines SSL2*a* through SSL4*a* may have the second threshold voltage Vth2, which is lower than the first threshold voltage Vth1. The second threshold voltage Vth2 may correspond to the erase voltage.

Accordingly, one of the first vertical channel structures VC1*a* through VC4*a* may be selected by controlling voltages respectively applied to the first through fourth string selection lines SSL1*a* through SSL4*a* and threshold voltages of respective string selection transistors connected to each of the first through fourth string selection lines SSL1*a* through SSL4*a*. In some example embodiments, the first memory block BLKa1 may further include a global string selection line. For example, the global string selection line may extend in the first horizontal direction HD1 between the bit line BL and the first string selection line SSL1*a*.

Figure 20:
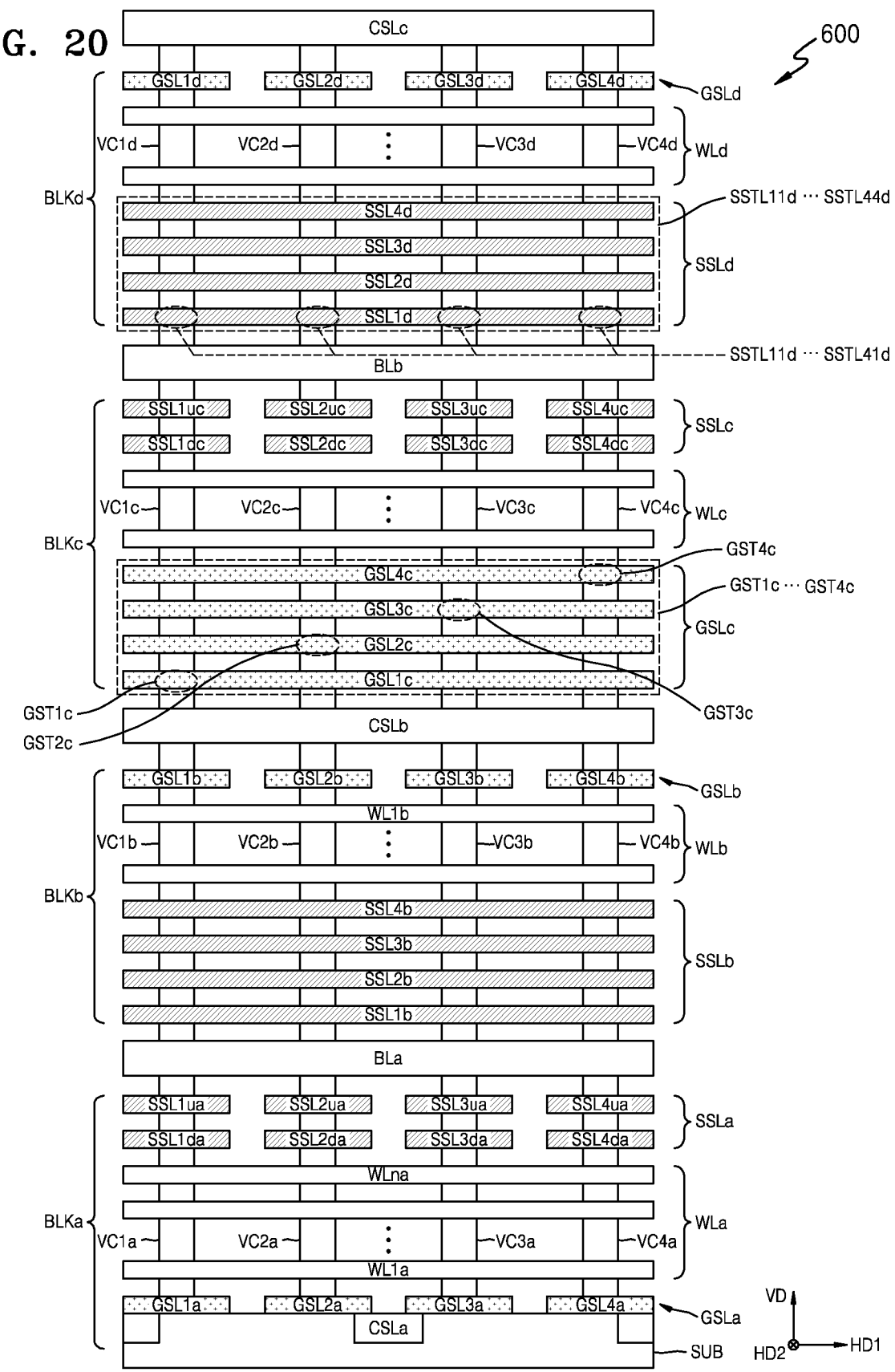
FIG. 20 is a cross-sectional view of a 3D memory device according to some example embodiments of the inventive concepts.

FIG. 20 is a cross-sectional view of a 3D memory device 600 according to some example embodiments of the inventive concepts.

Referring to FIG. 20, the 3D memory device 600 may include first through fourth memory blocks BLKa, BLKb, BLKc, and BLKd in the vertical direction VD. For example, the first and second memory blocks BLKa and the BLKb may respectively correspond to the first and second memory blocks BLKa and the BLKb of FIG. 5. The descriptions made with reference to FIGS. 5 through 14B may refer to the example embodiments shown in FIG. 20.

The 3D memory device 600 may further include bit lines BLa and BLb extending in the first horizontal direction HD1 and common source lines CSLb and CSLc extending in the first horizontal direction HD1. The bit line BLa may be between the first and second memory blocks BLKa and the BLKb. The first and second memory blocks BLKa and the BLKb may share the bit line BLa. The bit line BLb may be between the third and fourth memory blocks BLKc and the BLKd, and thus may be understood to be on (e.g., above) the third memory block BLKc, such that the fourth memory block BLKd is understood to be on (e.g., above) the bit line BLb. The third and fourth memory blocks BLKc and the BLKd may share the bit line BLb. The common source line CSLb may be between the second and third memory blocks BLKb and the BLKc. The second and third memory blocks BLKb and the BLKc may share the common source line CSLb.

The third memory block BLKc may include third vertical channel structures VC1*c* through VC4*c* extending in the vertical direction VD and on the common source line CSLb in the vertical direction VD. The third memory block BLKc may also include first through fourth ground selection lines GSL1*c* through GSL4*c*, word lines WL*c*, first through fourth lower string selection lines SSL1*dc* through SSL4*dc*, and first through fourth upper string selection lines SSL1*uc* through SSL4*uc*. The first through fourth ground selection lines GSL1*c* through GSL4*c* and the word lines WL*c* may extend in the first horizontal direction HD1. The first through fourth ground selection lines GSL1*c* through GSL4*c* may be offset (e.g., "stacked") in the vertical direction VD.

The first through fourth lower string selection lines SSL1dc through SSL4dc and the first through fourth upper string selection lines SSL1uc through SSL4uc may extend in the second horizontal direction HD2.

As shown in FIG. 20, the third memory block BLKc may include ground selection transistors (e.g., GST1c through GST4c) that are connected to at least the common source line CSLb and one ground selection line of the first through fourth ground selection lines GSL1c through GSL4c and further have different threshold voltages from each other.

In detail, in the third memory block BLKc, ground selection transistors located at the same level may be connected in common to a single ground selection line and may have different threshold voltages from each other. In detail, at least one of threshold voltages of respective ground selection transistors connected to the first ground selection line GSL1c may be different from the other threshold voltages. For example, among the ground selection transistors connected to the first ground selection line GSL1c, a ground selection transistor in the third vertical channel structure VC1c may have the first threshold voltage Vth1 and ground selection transistors respectively in the other third vertical channel structures VC2c through VC4c may have the second threshold voltage Vth2, which is lower than the first threshold voltage Vth1. The second threshold voltage Vth2 may correspond to an erase voltage.

In addition, in the third memory block BLKc, ground selection transistors in one NAND string may be respectively connected to different ground selection lines and have different threshold voltages from each other. In detail, at least one of threshold voltages of respective ground selection transistors in the third vertical channel structure VC1c may be different from the other threshold voltages. For example, a ground selection transistor connected to the first ground selection line GSL1c may have the first threshold voltage Vth1, and ground selection transistors respectively connected to the second through fourth ground selection lines GSL2c through GSL4c may have the second threshold voltage Vth2, which is lower than the first threshold voltage Vth1. The second threshold voltage Vth2 may correspond to the erase voltage.

Accordingly, one of the third vertical channel structures VC1c through VC4c may be selected by controlling voltages respectively applied to the first through fourth ground selection lines GSL1c through GSL4c and threshold voltages of respective ground selection transistors connected to each of the first through fourth ground selection lines GSL1c through GSL4c. In some example embodiments, the third memory block BLKc may further include a global ground selection line. For example, the global ground selection line may extend in the first horizontal direction HD1 between the common source line CSLb and the first ground selection line GSL1c.

The fourth memory block BLKd may include fourth vertical channel structures VC1d through VC4d extending in the vertical direction VD. The fourth memory block BLKd may also include first through fourth ground selection lines GSL1d through GSL4d, word lines WLd, and first through fourth string selection lines SSL1d through SSL4d. The word lines WLd and the first through fourth string selection lines SSL1d through SSL4d may extend in the first horizontal direction HD1. As shown in FIG. 20, the first through fourth string selection lines SSL1d through SSL4d may be offset ("stacked") in the vertical direction. The first through fourth ground selection lines GSL1d through GSL4d may extend in the second horizontal direction HD2.

As shown in FIG. 20, the fourth memory block BLKd may include first through fourth string selection transistors (e.g., SSTL11d through SSTL44d), where at least some of the string selection transistors (e.g., SSTL11d through SSTL41d) are connected to bit line BLb and the first string selection line SSL1d and further have different threshold voltages from each other.

In detail, in the fourth memory block BLKd, string selection transistors located at the same level may be connected in common to a single string selection line and may have different threshold voltages from each other. In detail, at least one of threshold voltages of respective string selection transistors connected to the first string selection line SSL1d may be different from the other threshold voltages. For example, among the string selection transistors connected to the first string selection line SSL1d, a string selection transistor in the fourth vertical channel structure VC1d may have the first threshold voltage Vth1 and string selection transistors respectively in the other fourth vertical channel structures VC2d through VC4d may have the second threshold voltage Vth2, which is lower than the first threshold voltage Vth1. The second threshold voltage Vth2 may correspond to the erase voltage.

In addition, in the fourth memory block BLKd, string selection transistors in one NAND string may be respectively connected to different string selection lines and have different threshold voltages from each other. In detail, at least one of threshold voltages of respective string selection transistors in the fourth vertical channel structure VC1d may be different from the other threshold voltages. For example, a string selection transistor connected to the first string selection line SSL1d may have the first threshold voltage Vth1, and string selection transistors respectively connected to the second through fourth string selection lines SSL2d through SSL4d may have the second threshold voltage Vth2, which is lower than the first threshold voltage Vth1. The second threshold voltage Vth2 may correspond to the erase voltage.

Accordingly, one of the first vertical channel structures VC1d through VC4d may be selected by controlling voltages respectively applied to the first through fourth string selection lines SSL1d through SSL4d and threshold voltages of respective string selection transistors connected to each of the first through fourth string selection lines SSL1d through SSL4d. In some example embodiments, the fourth memory block BLKd may further include a global string selection line. For example, the global string selection line may extend in the first horizontal direction HD1 between the bit line BLb and the first string selection line SSL1d.

Figure 21:
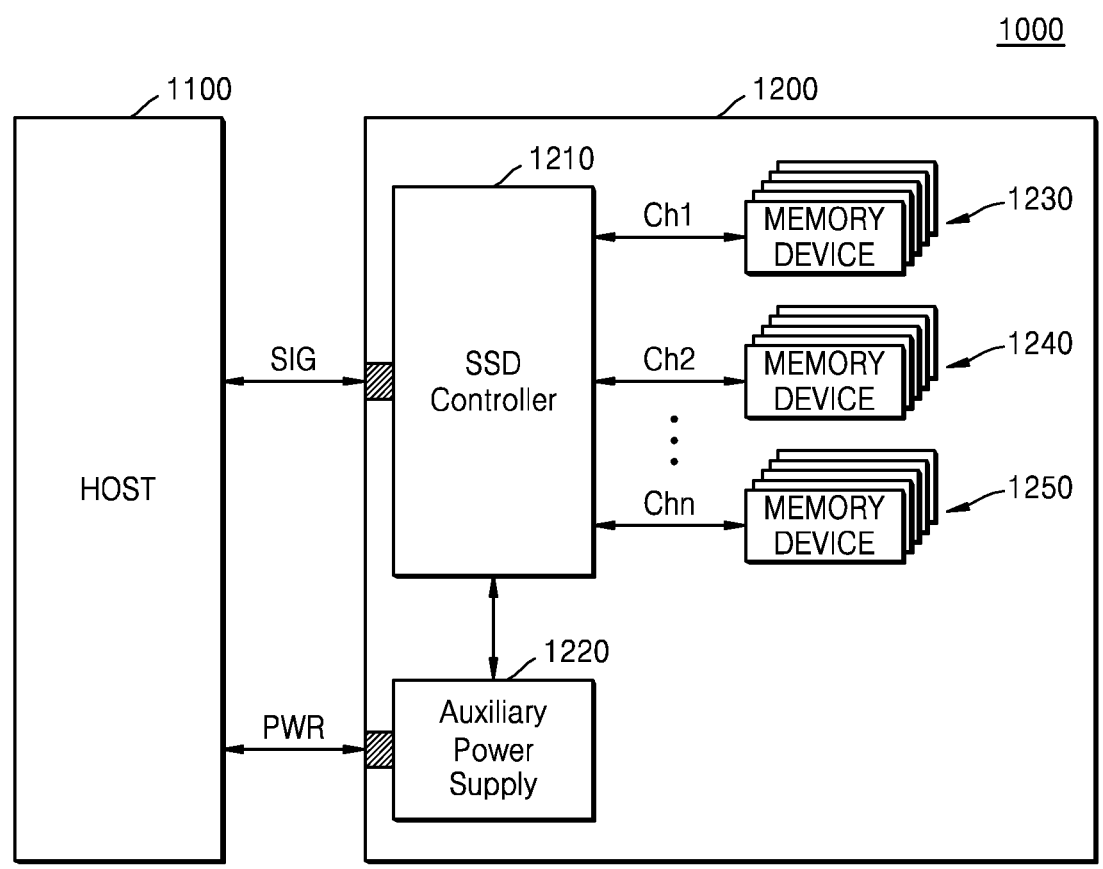
FIG. 21 is a block diagram of an example of applying a 3D memory device to a solid state drive (SSD) system, according to some example embodiments of the inventive concepts.

FIG. 21 is a block diagram of an example of applying a 3D memory device to a solid state drive (SSD) system 1000, according to some example embodiments of the inventive concepts.

Referring to FIG. 21, the SSD system 1000 may include a host 1100 and an SSD 1200. The SSD 1200 exchanges signals SIG with the host 1100 through a signal connector and receives power PWR from the host 1100 through a power connector. The SSD 1200 may include an SSD controller 1210, an auxiliary power supply 1220, and memory devices 1230, 1240, and 1250. The memory devices 1230, 1240, and 1250 may be connected to the SSD controller 1210 through channels Ch1, Ch2, and Chn, respectively. The memory devices 1230, 1240, and 1250 may be implemented using 3D memory devices described above with reference to FIGS. 1 through 20.

While the inventive concepts has been particularly shown and described with reference to embodiments thereof, it will be understood that various changes in form and details may be made therein without departing from the spirit and scope of the following claims.

What is claimed is:

1. A three-dimensional (3D) memory device, comprising:
a first memory block including a plurality of first vertical channel structures, each first vertical channel structure of the plurality of first vertical channel structures extending in a vertical direction that is substantially perpendicular with respect to a surface of a substrate;
a second memory block including a plurality of second vertical channel structures, a first string selection line, and a second string selection line, each second vertical channel structure of the plurality of second vertical channel structures offset above the plurality of first vertical channel structures in the vertical direction, the first string selection line and the second string selection line extending in a first horizontal direction and being offset from each other in the vertical direction, the first horizontal direction being substantially parallel with respect to the surface of the substrate; and
a bit line extending in the first horizontal direction between the first memory block and the second memory block and configured to be shared by the first and second memory blocks,
wherein the second memory block further includes a first string selection transistor and a second string selection transistor, the first string selection transistor and the second string selection transistor each connected to the bit line and the first string selection line, the first string selection transistor and the second string selection transistor having different threshold voltages from each other.

2. The 3D memory device of claim 1, wherein
the second memory block further includes a third string selection transistor connected to the bit line and the second string selection line and offset in the vertical direction with respect to the first string selection transistor, and
the first string selection transistor and the third string selection transistor have different threshold voltages from each other.

3. The 3D memory device of claim 2, wherein the second memory block further includes a fourth string selection transistor connected to the bit line and the second string selection line and offset in the vertical direction with respect to the second string selection transistor,
the first and fourth string selection transistors have a first threshold voltage, and
the second and third string selection transistors have a second threshold voltage, the second threshold voltage being less than the first threshold voltage.

4. The 3D memory device of claim 3, wherein
the 3D memory device is configured to apply a first bias voltage to the first string selection line, the first bias voltage greater than the first threshold voltage, and
the 3D memory device is configured to apply a second bias voltage to the second string selection line such that one string selection transistor of the first string selection transistor and the second string selection transistor connected to the first string selection line is selected, the second bias voltage greater than the second threshold voltage and less than the first threshold voltage.

5. The 3D memory device of claim 1, wherein the first memory block further includes a plurality of string selection lines extending in a second horizontal direction and parallel to each other in the first horizontal direction, the second horizontal direction being substantially parallel with respect to the surface of the substrate and substantially perpendicular with respect to the first horizontal direction.

6. The 3D memory device of claim 1, wherein the first memory block further includes
an upper string selection line adjacent to the bit line in the vertical direction and extending in a second horizontal direction; and
a lower string selection line adjacent to the upper string selection line in the vertical direction and extending in the second horizontal direction, and
the upper string selection line is closer to the bit line than the lower string selection line.

7. The 3D memory device of claim 6, wherein the first memory block further includes
an upper string selection transistor connected to the upper string selection line and having a first threshold voltage; and
a lower string selection transistor connected to the lower string selection line and having a second threshold voltage that is less than the first threshold voltage.

8. The 3D memory device of claim 1, wherein the first memory block further includes a plurality of string selection lines extending in the first horizontal direction and offset in the vertical direction.

9. The 3D memory device of claim 1, further comprising:
a third memory block offset in the first horizontal direction with respect to the second memory block, the third memory block including a second global string selection line at a same level in the vertical direction as a first global string selection line of the second memory block,
wherein the second memory block includes the first global string selection line between the bit line and the first and second string selection lines,
wherein the first and second string selection lines each extend across the second and third memory blocks.

10. The 3D memory device of claim 1, wherein the first memory block includes a plurality of memory cells that are configured to be sequentially programmed starting from a memory cell proximate to the bit line to a memory cell distal from the bit line.

11. The 3D memory device of claim 1, wherein the second memory block includes a plurality of memory cells that are configured to be sequentially programmed starting from a memory cell distal from the bit line to a memory cell proximate to the bit line.

12. The 3D memory device of claim 1, wherein the first memory block is on the substrate, and the second memory block is on the bit line and further includes a second common source line connected in common to the second vertical channel structures and extending in the first horizontal direction.

13. The 3D memory device of claim 12, wherein
the first memory block includes a plurality of memory cells that are configured to be erased based on application of an erase voltage to the substrate, and
the second memory block includes a separate plurality of memory cells that are configured to be erased based on application of the erase voltage to the second common source line.

14. The 3D memory device of claim 12, wherein the first memory block and the second memory block each include a separate plurality of memory cells that are configured to be erased based on application of an erase voltage to the bit line.

15. The 3D memory device of claim 12, wherein
the first memory block further includes a first ground selection line extending in a second horizontal direction on the substrate,
the 3D memory device is configured to apply a first ground selection voltage to the first ground selection line in accordance with a program operation on the first memory block,
the second memory block further includes a second ground selection line extending in the second horizontal direction on the second common source line, and
the 3D memory device is configured to apply a second ground selection voltage to the second ground selection line in accordance with a program operation on the second memory block.

16. The 3D memory device of claim 12, wherein
the first memory block further includes a first common source line extending in a second horizontal direction on the substrate,
the 3D memory device is configured to apply a second common source selection voltage to the second common source line during a program operation on the second memory block, and
the 3D memory device is configured to apply a first common source selection voltage to the first common source line during a program operation on the first memory block, the first common source selection voltage greater than the second common source selection voltage.

17. The 3D memory device of claim 1, wherein a quantity of word lines included in the second memory block is smaller than a quantity of word lines included in the first memory block.

18. The 3D memory device of claim 1, wherein the first and second string selection lines each have a plate shape.

19. A three-dimensional (3D) memory device comprising:
a first memory block including a plurality of first vertical channel structures offset in a vertical direction that is substantially perpendicular with respect to a surface of a substrate;
a second memory block including a plurality of second vertical channel structures on the first vertical channel structures in the vertical direction; and
a bit line extending in a first horizontal direction between the first memory block and the second memory block, the bit line configured to be shared by the first memory block and the second memory block, the first horizontal direction being substantially parallel with respect to the surface of the substrate,
wherein the first memory block further includes
a first upper string selection line extending in a second horizontal direction on the bit line, the second horizontal direction being substantially parallel with respect to the surface of the substrate and substantially perpendicular with respect to the first horizontal direction;
a first lower string selection line extending in the second horizontal direction on the first upper string selection line;
a first upper string selection transistor connected to the first upper string selection line and having a first threshold voltage; and
a first lower string selection transistor connected to the first lower string selection line and having a second threshold voltage, the second threshold voltage less than the first threshold voltage.

20. A three-dimensional (3D) memory device comprising:
a first memory block including a plurality of first vertical channel structures, each first vertical channel structure of the plurality of first vertical channel structures extending in a vertical direction that is substantially perpendicular with respect to a surface of a substrate;
a first bit line on the first memory block in the vertical direction and extending in a first horizontal direction, the first horizontal direction being substantially parallel with respect to the surface of the substrate;
a second memory block on the first bit line in the vertical direction, the second memory block including a plurality of second vertical channel structures;
a first common source line located on the second memory block in the vertical direction and extending in the first horizontal direction; and
a third memory block including a plurality of third vertical channel structures, a plurality of ground selection lines, and a plurality of ground selection transistors, the plurality of third vertical channel structures on the first common source line in the vertical direction, the plurality of ground selection lines extending in the first horizontal direction and offset in the vertical direction, and the plurality of ground selection transistors being connected to the first common source line and one of the plurality of ground selection lines and having different threshold voltages from each other,
wherein the first memory block and the second memory block share the first bit line, and the second memory block and the third memory block share the first common source line.

* * * * *